US011578851B2

(12) United States Patent
Nishimura et al.

(10) Patent No.: US 11,578,851 B2
(45) Date of Patent: Feb. 14, 2023

(54) LIGHT-EMITTING DEVICE, DISPLAY APPARATUS AND LIGHTING APPARATUS

(71) Applicant: Saturn Licensing LLC, New York, NY (US)

(72) Inventors: Takeshi Nishimura, Saitama (JP); Takuya Shima, Chiba (JP)

(73) Assignee: SATURN LICENSING LLC, New York, NY (US)

(*) Notice: Subject to any disclaimer, the term of this patent is extended or adjusted under 35 U.S.C. 154(b) by 0 days.

(21) Appl. No.: 17/560,952

(22) Filed: Dec. 23, 2021

(65) Prior Publication Data

US 2022/0113002 A1    Apr. 14, 2022

Related U.S. Application Data

(63) Continuation of application No. 15/750,537, filed as application No. PCT/JP2016/069928 on Jul. 5, 2016, now Pat. No. 11,242,975.

(30) Foreign Application Priority Data

Aug. 26, 2015    (JP) .............................. JP2015-167267

(51) Int. Cl.
*F21V 5/00* (2018.01)
*H01L 33/60* (2010.01)
(Continued)

(52) U.S. Cl.
CPC .................. *F21V 5/00* (2013.01); *F21S 2/00* (2013.01); *F21V 7/00* (2013.01); *F21V 7/05* (2013.01);
(Continued)

(58) Field of Classification Search
CPC ...... F21V 7/05; F21V 13/04; G02F 1/133603; G02F 1/133605; G02F 1/133606; G02F 1/133607; H01L 33/58
(Continued)

(56) References Cited

U.S. PATENT DOCUMENTS

2007/0230206 A1    10/2007   Hsiao et al.
2012/0057097 A1     3/2012   Shimizu
(Continued)

FOREIGN PATENT DOCUMENTS

CN         1932618 A      3/2007
CN       102667311 A      9/2012
(Continued)

OTHER PUBLICATIONS

Chinese Office Action including Search Report for Application No. 201680047742.7, dated Sep. 27, 2019, 8 pages.
(Continued)

*Primary Examiner* — Charles S Chang
(74) *Attorney, Agent, or Firm* — Richard LaPeruta

(57) ABSTRACT

Provided is a light-emitting device with reduced in-plane luminance variation. The light-emitting device includes a main substrate, a plurality of light sources, a plurality of lenses, and one or more light reflection members. The main substrate includes a central part and a peripheral part that surrounds the central part. The plurality of light sources are each disposed on the central part of the main substrate. The plurality of lenses are disposed to correspond to the plurality of light sources respectively. The plurality of lenses apply optical effects to beams of light from the plurality of light sources respectively. One or more light reflection members are each disposed on the peripheral part. The light reflection members each have reflectance that is higher than the reflectance of the main substrate.

18 Claims, 25 Drawing Sheets

(51) Int. Cl.
| | |
|---|---|
| *F21V 7/00* | (2006.01) |
| *G02F 1/13357* | (2006.01) |
| *F21S 2/00* | (2016.01) |
| *F21V 19/00* | (2006.01) |
| *F21V 7/05* | (2006.01) |
| *F21V 13/04* | (2006.01) |
| *H01L 25/075* | (2006.01) |
| *H01L 33/58* | (2010.01) |
| *G02F 1/1335* | (2006.01) |
| *F21Y 115/10* | (2016.01) |
| *F21S 6/00* | (2006.01) |
| *F21S 8/02* | (2006.01) |

(52) U.S. Cl.
CPC .............. *F21V 13/04* (2013.01); *F21V 19/00* (2013.01); *G02F 1/133603* (2013.01); *G02F 1/133605* (2013.01); *G02F 1/133606* (2013.01); *H01L 25/0753* (2013.01); *H01L 33/60* (2013.01); *F21S 6/002* (2013.01); *F21S 8/026* (2013.01); *F21Y 2115/10* (2016.08); *G02F 1/133607* (2021.01); *H01L 33/58* (2013.01)

(58) Field of Classification Search
USPC ...................................................... 349/61–68
See application file for complete search history.

(56) References Cited

U.S. PATENT DOCUMENTS

| | | | |
|---|---|---|---|
| 2012/0287347 A1 | 11/2012 | Matsumoto | |
| 2014/0104816 A1 | 4/2014 | Takasi et al. | |
| 2014/0226311 A1 | 8/2014 | Ono et al. | |
| 2014/0368768 A1* | 12/2014 | Sakai | G02F 1/133606 349/64 |
| 2015/0036317 A1 | 2/2015 | Yamamoto et al. | |
| 2015/0226400 A1 | 8/2015 | Wada et al. | |
| 2015/0309366 A1* | 10/2015 | Park | G02F 1/133308 445/24 |

FOREIGN PATENT DOCUMENTS

| | | |
|---|---|---|
| CN | 102803827 A | 11/2012 |
| CN | 103649620 A | 3/2014 |
| EP | 2426395 A1 | 3/2012 |
| EP | 2515027 A1 | 10/2012 |
| EP | 2821819 B1 | 4/2016 |
| JP | 2009164026 A | 7/2009 |
| JP | 2009-283988 A | 12/2009 |
| JP | 2013-012417 A | 1/2013 |
| JP | 5292476 B2 | 9/2013 |
| JP | 2014-013744 A | 1/2014 |
| JP | 2014-090055 A | 5/2014 |
| WO | 2011/074334 A1 | 6/2011 |
| WO | 2012/137765 A1 | 10/2012 |
| WO | 2013/001708 A1 | 1/2013 |
| WO | 2013021933 A1 | 2/2013 |

OTHER PUBLICATIONS

International Search Report and Written Opinion for PCT Application No. PCT/JP2016/069928, dated Aug. 2, 2016, 09 pages.

* cited by examiner

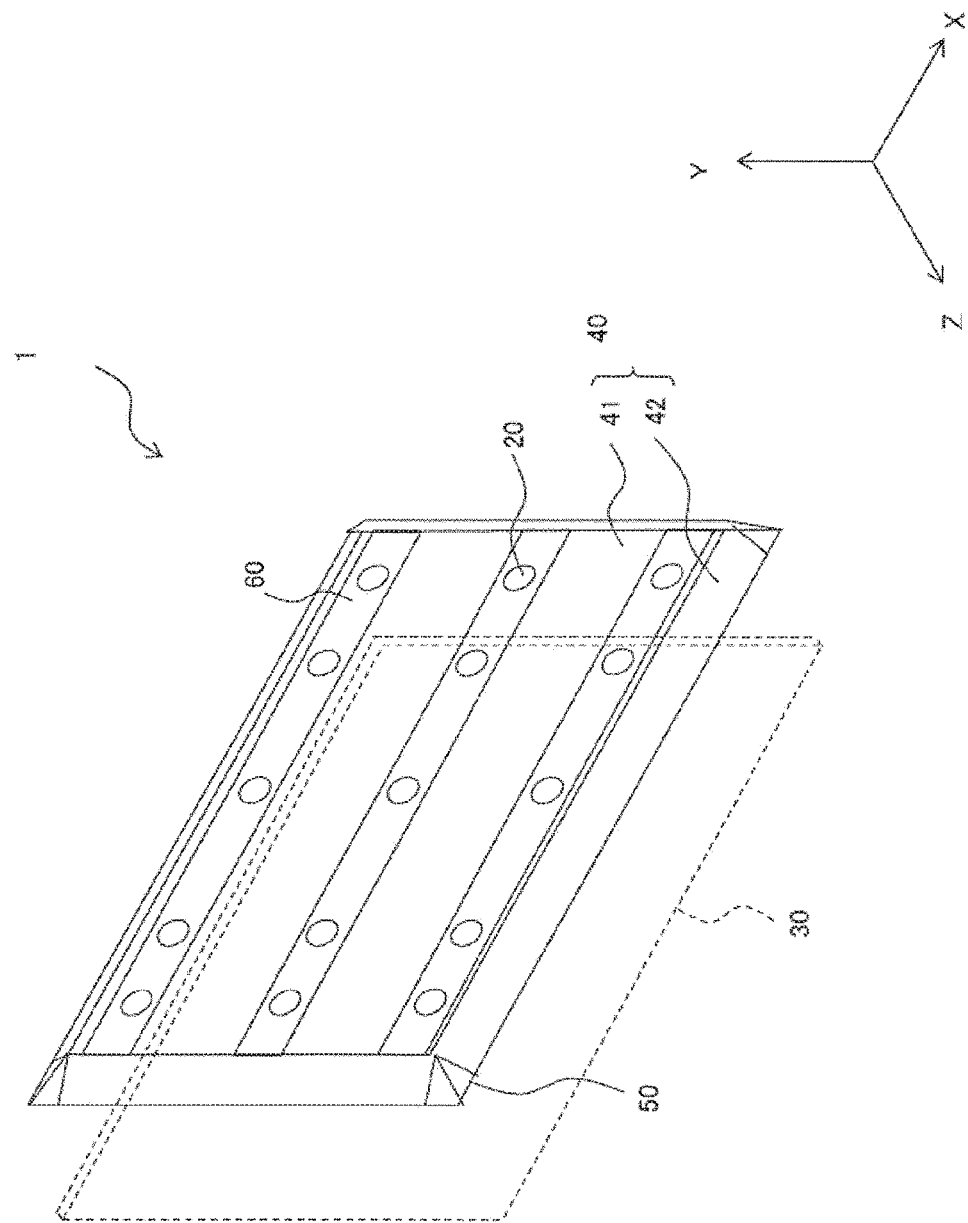
[FIG. 1]

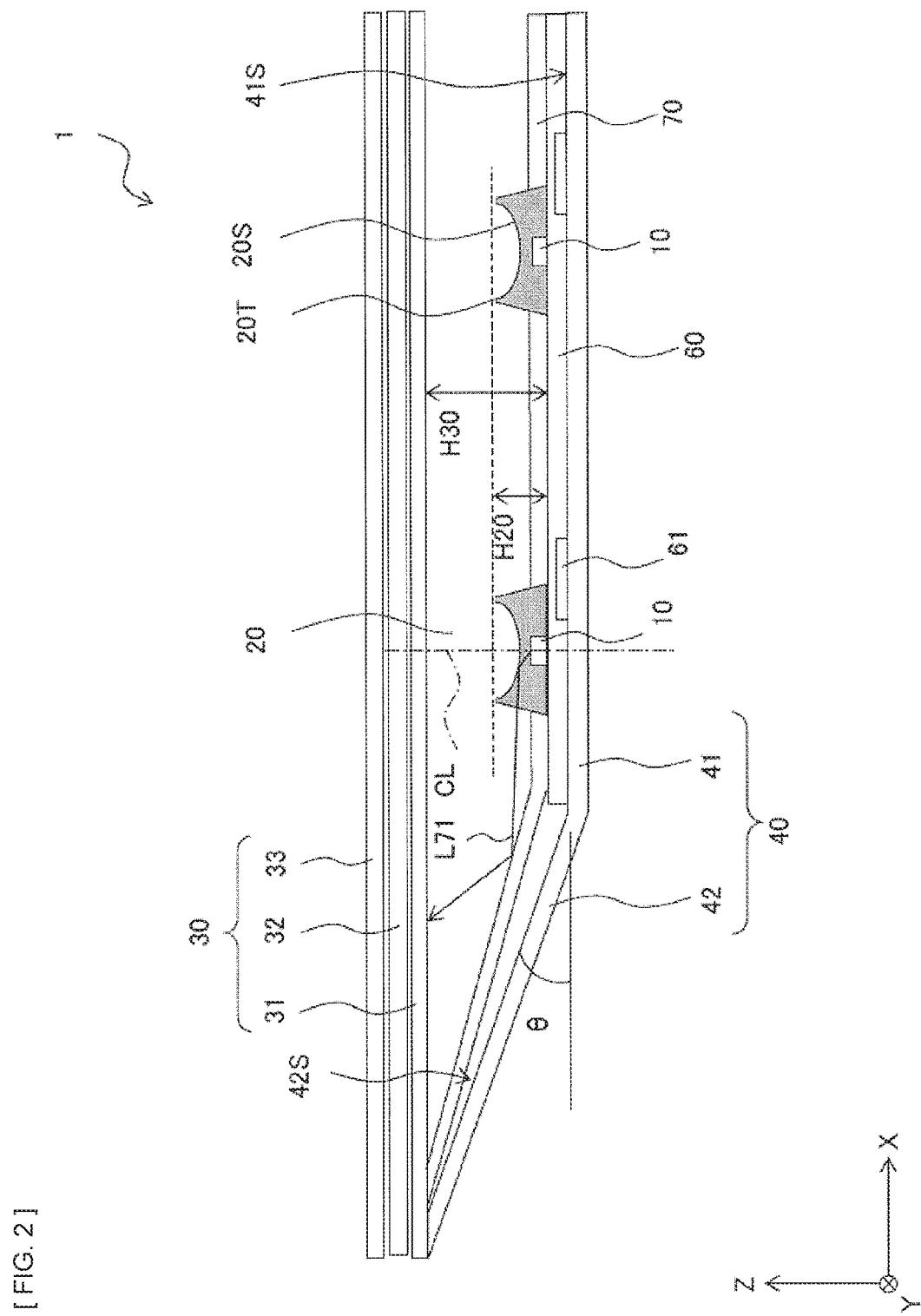

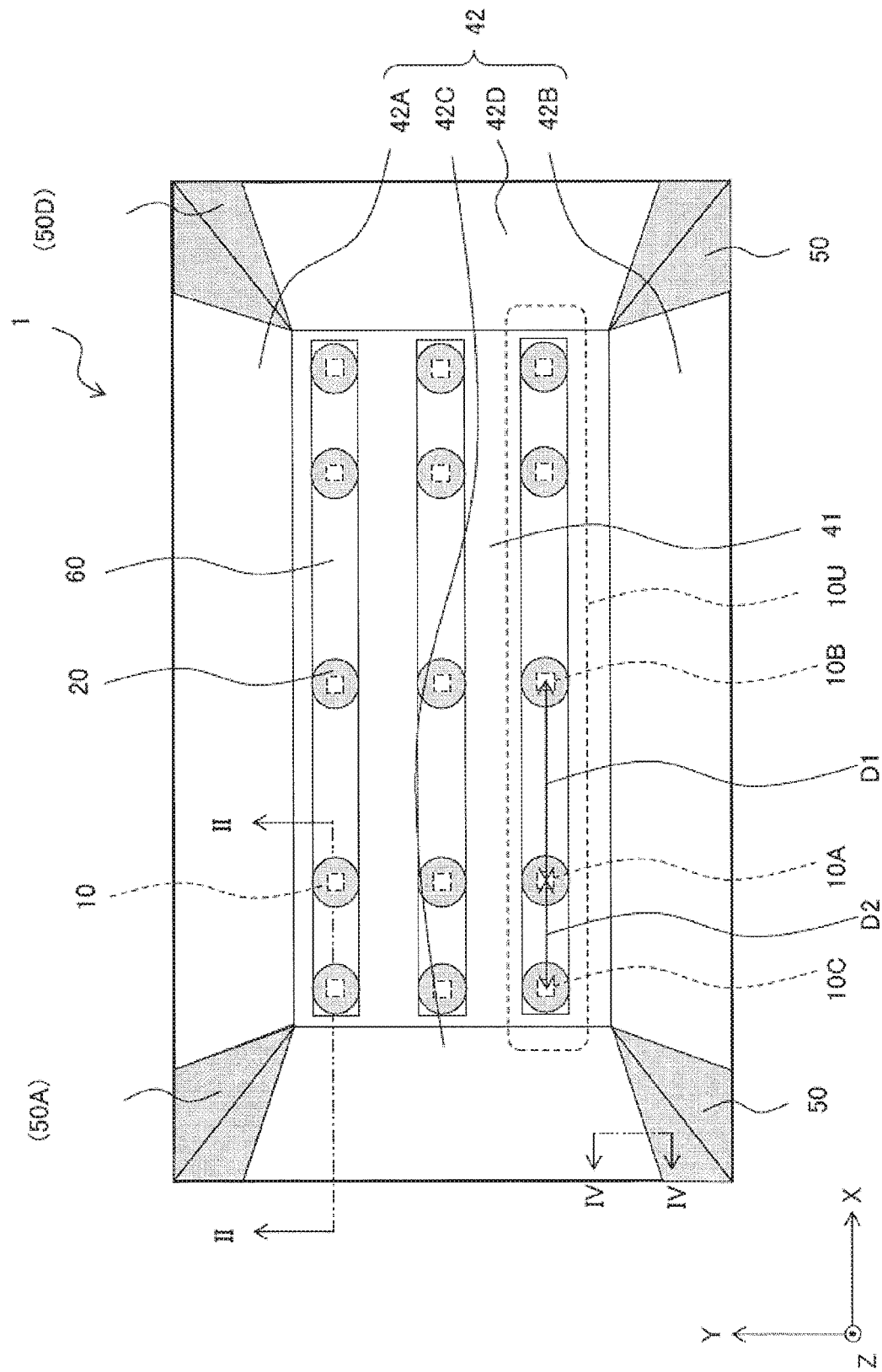
[FIG. 3]

[ FIG. 4 ]
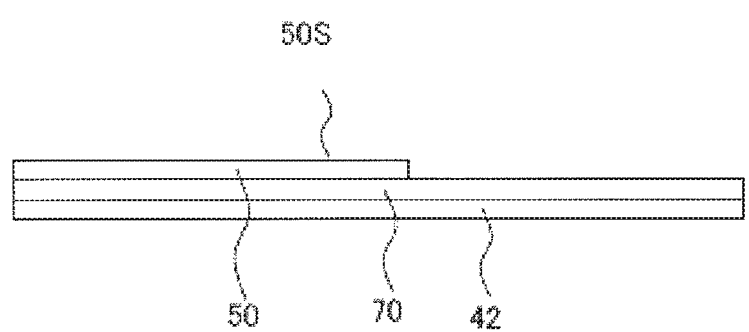

[ FIG. 5A ]
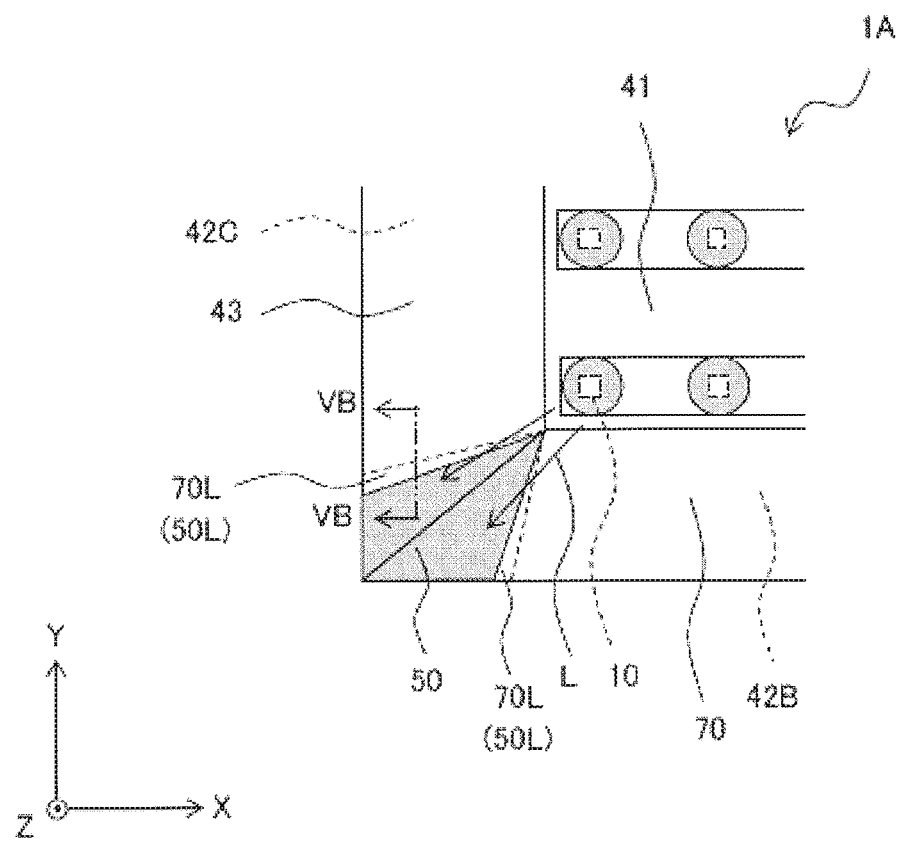
[ FIG. 5B ]
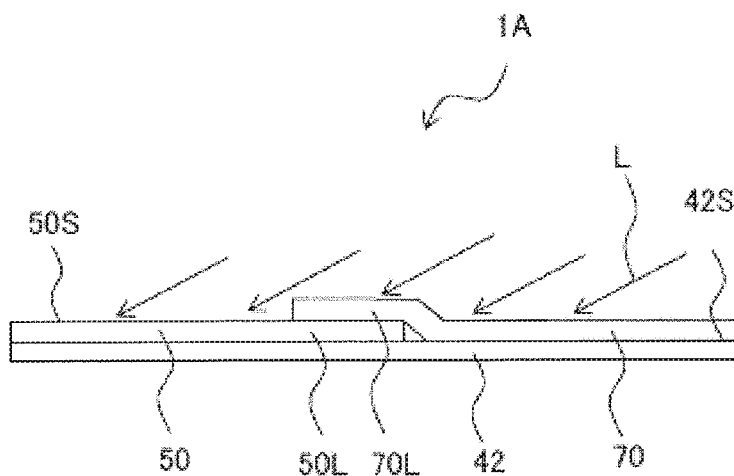

[ FIG. 5C ]
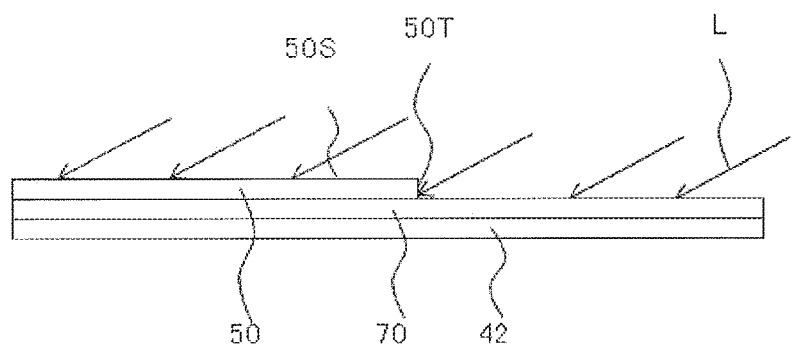
[ FIG. 6 ]
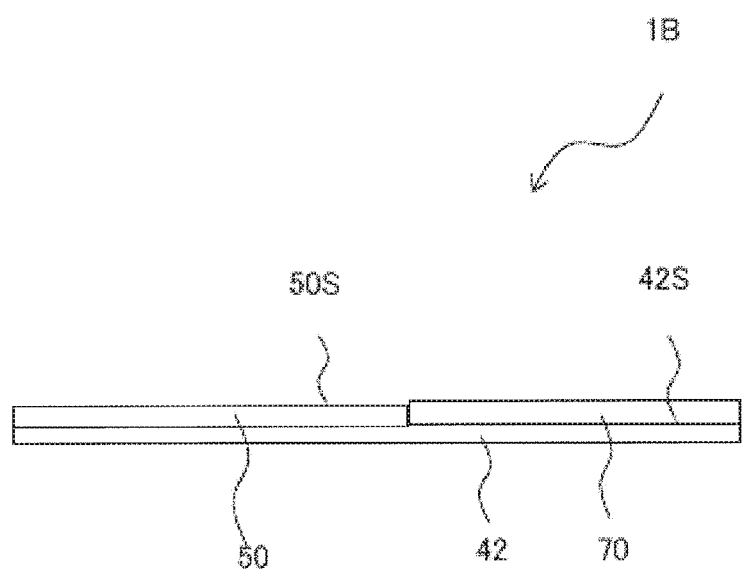

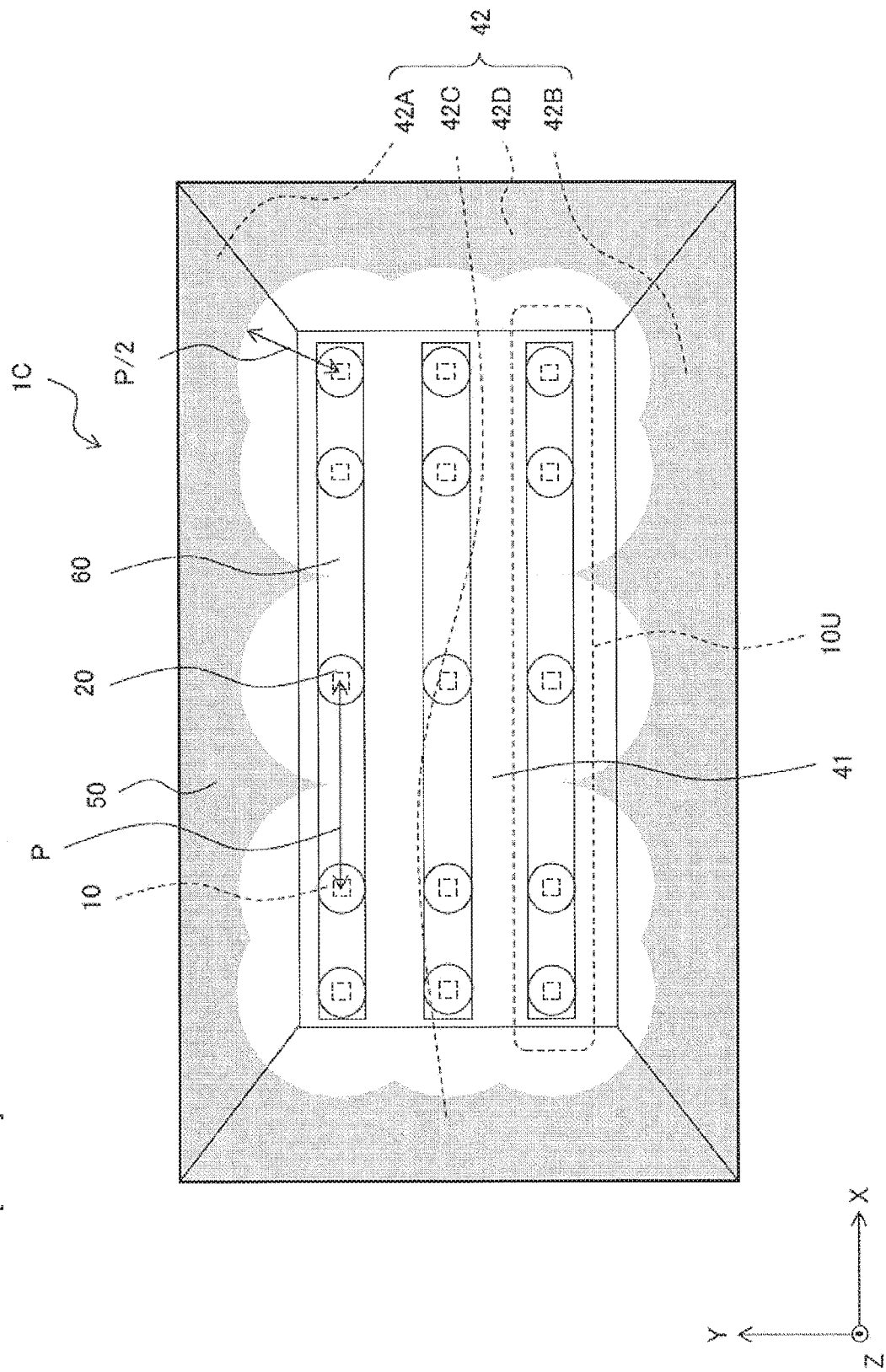
[FIG. 7]

[FIG. 8]
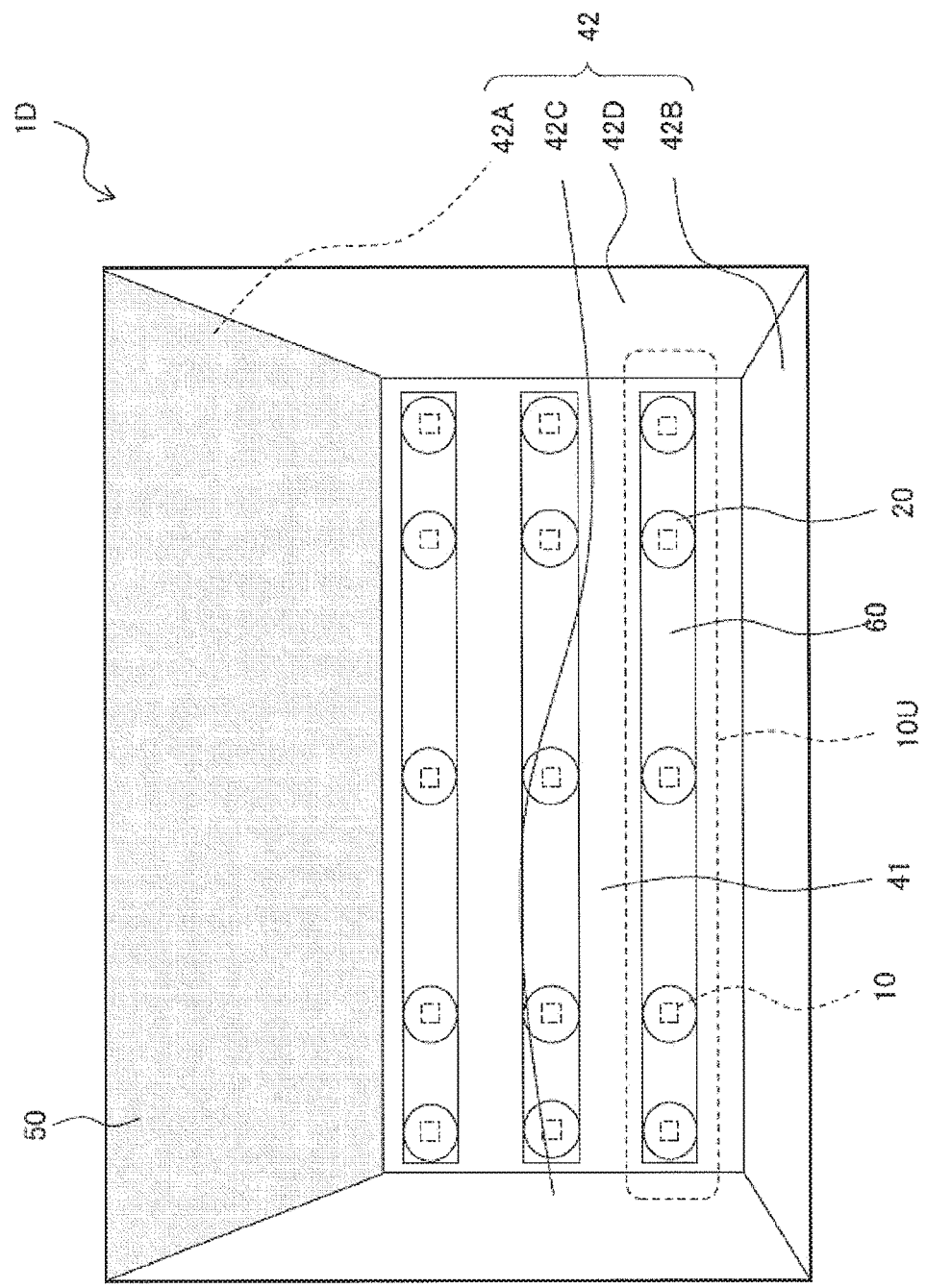

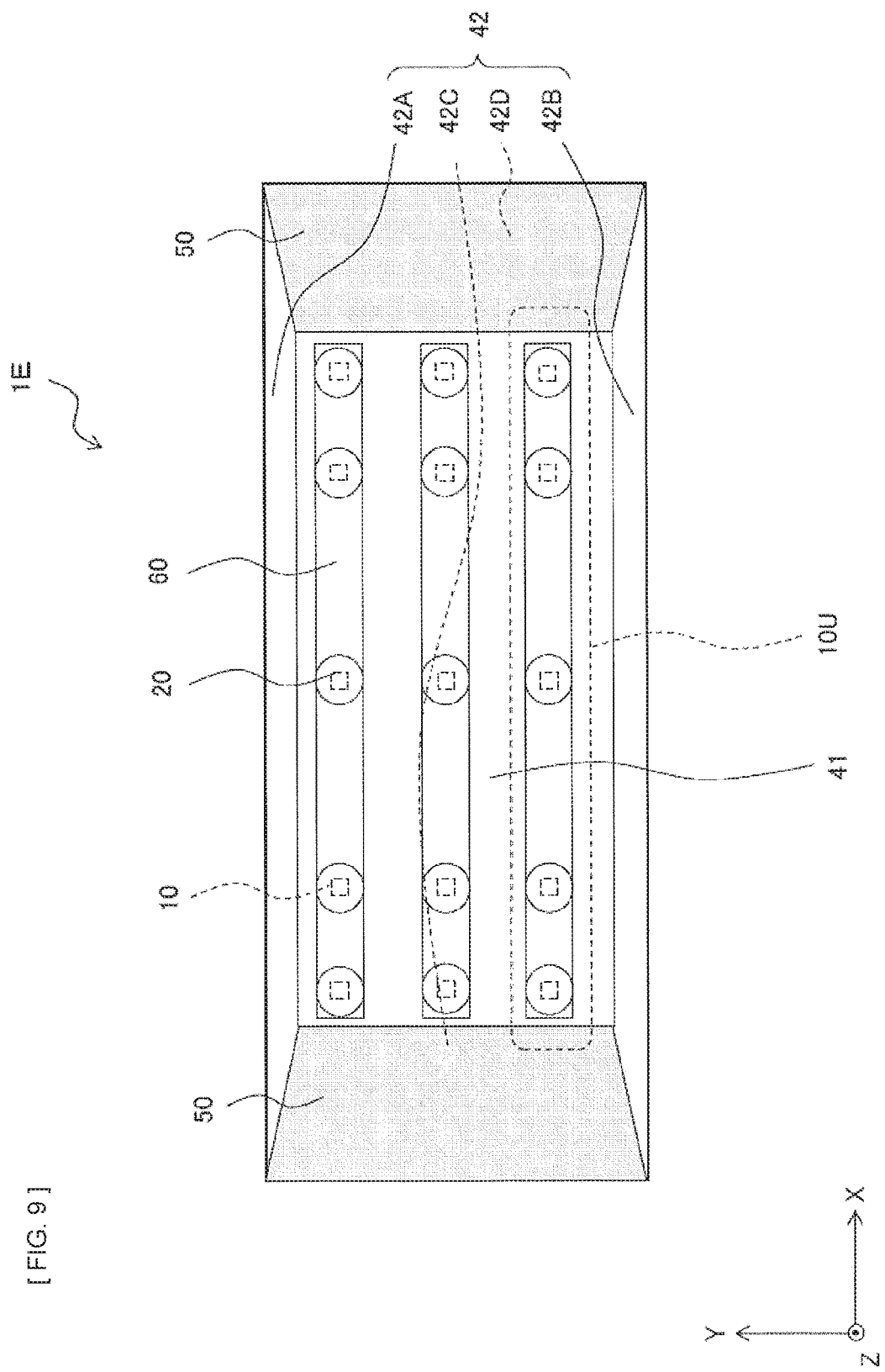

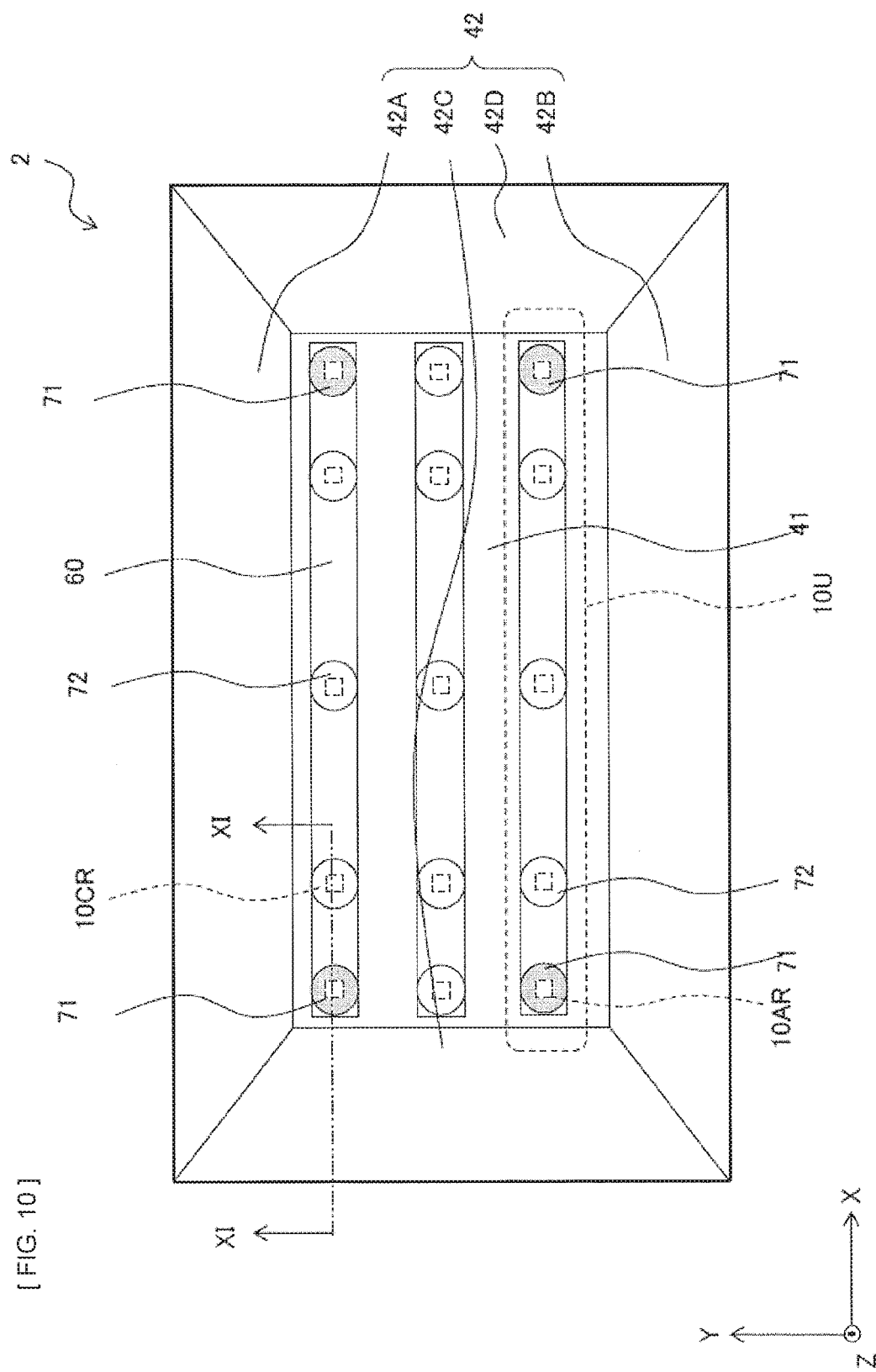
[FIG. 10]

[FIG. 11]
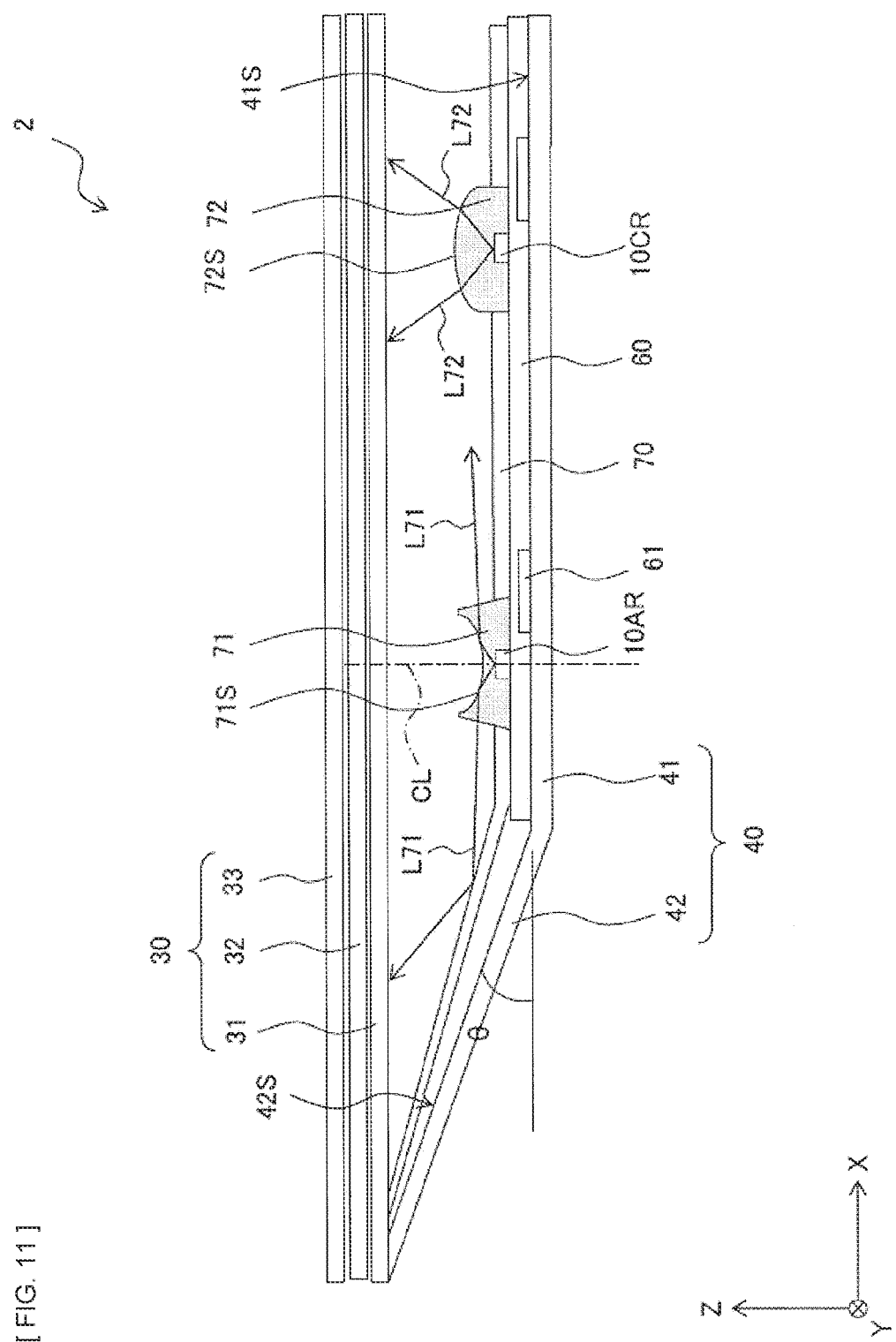

[FIG. 12]
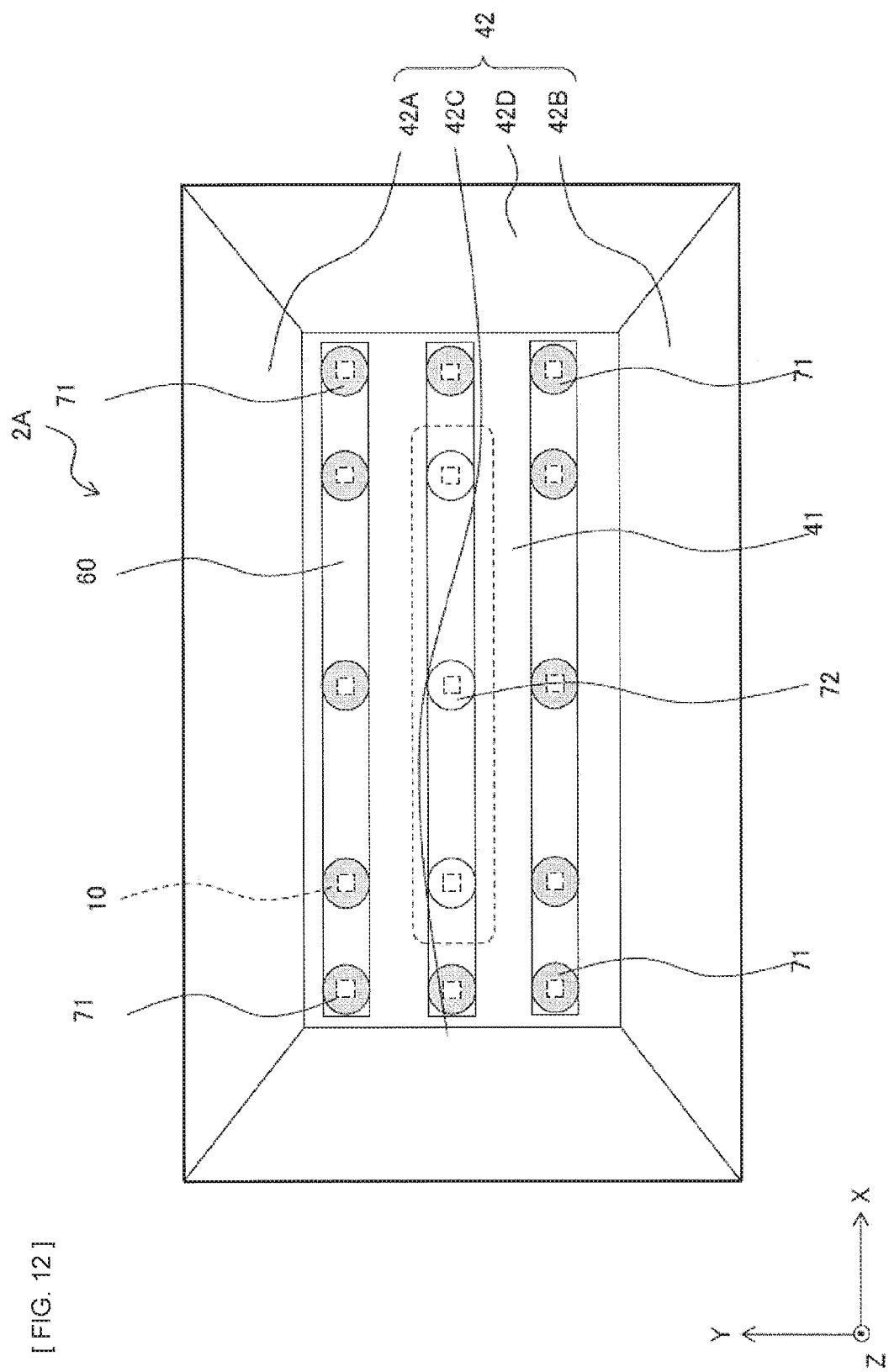

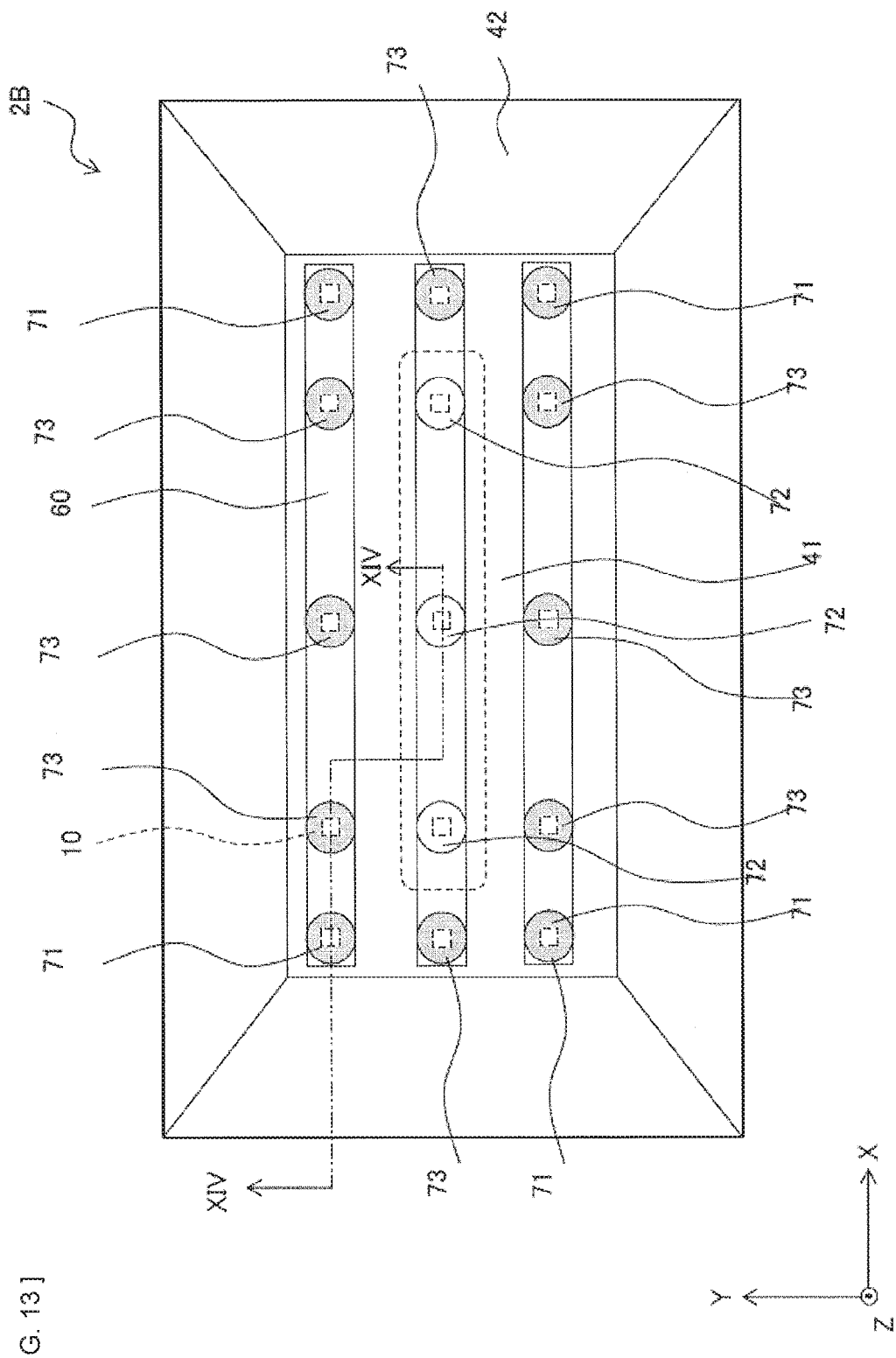
[FIG. 13]

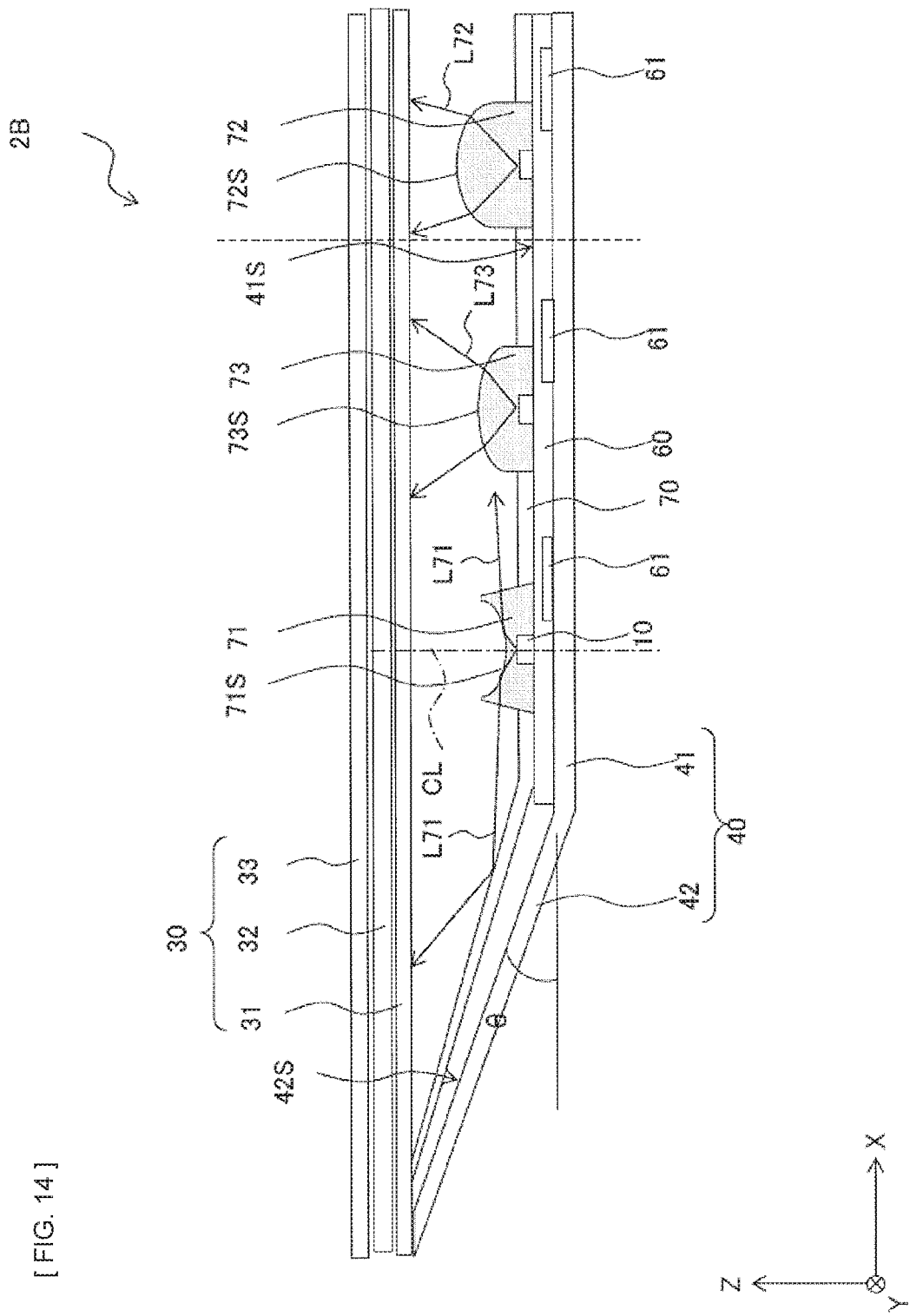
[FIG. 14]

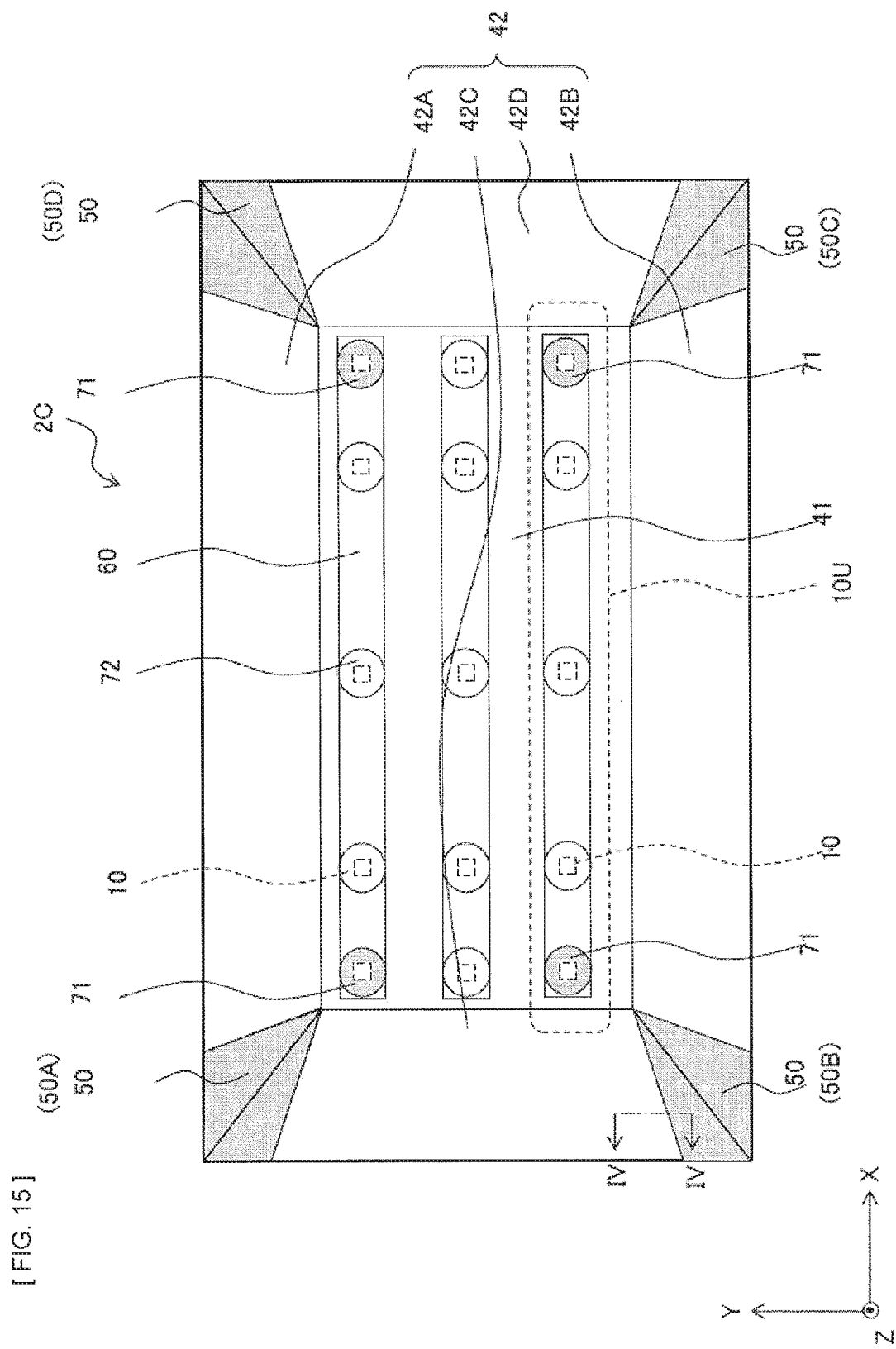
[FIG. 15]

[ FIG. 16 ]
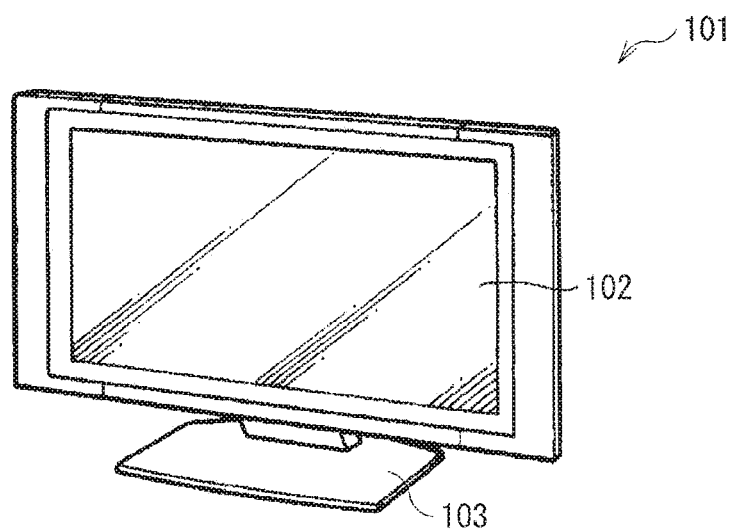

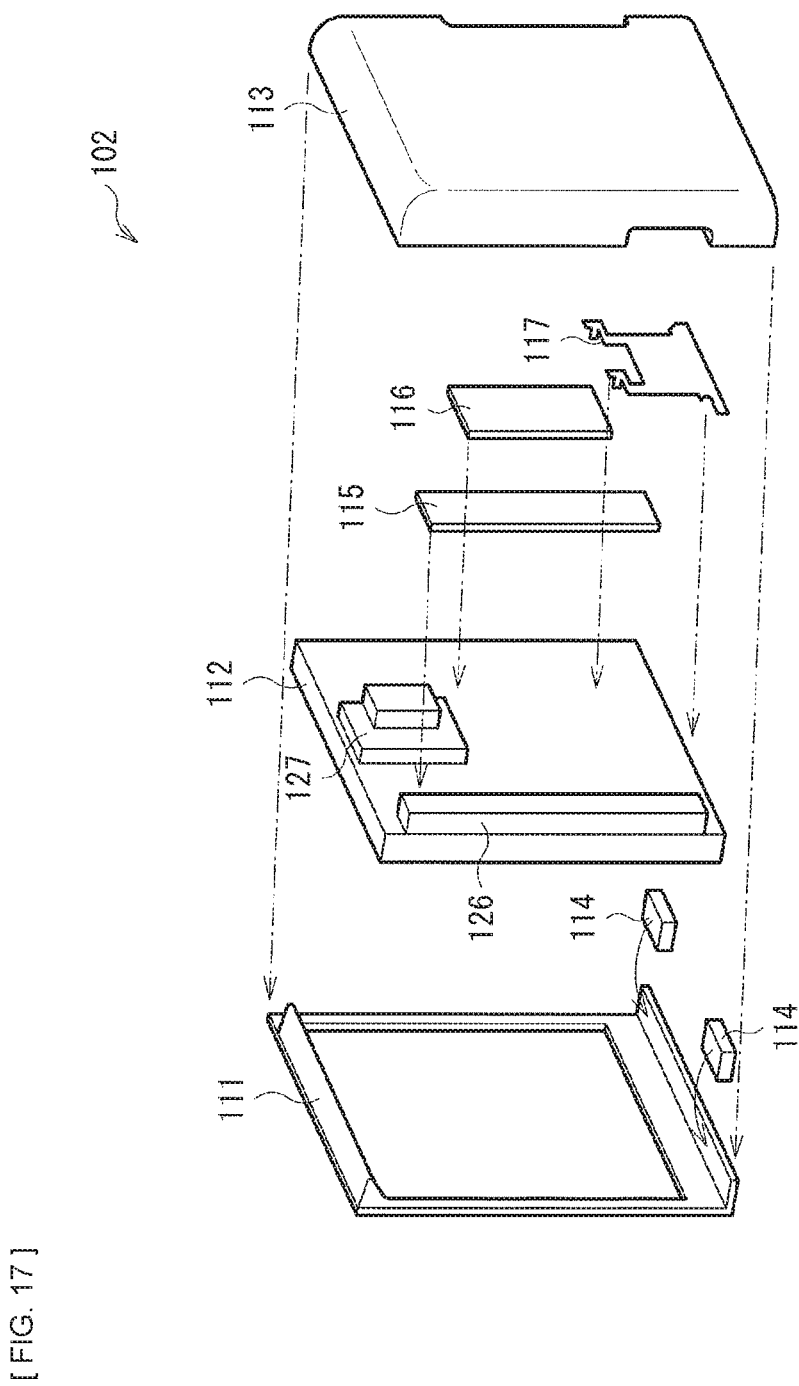
[FIG. 17]

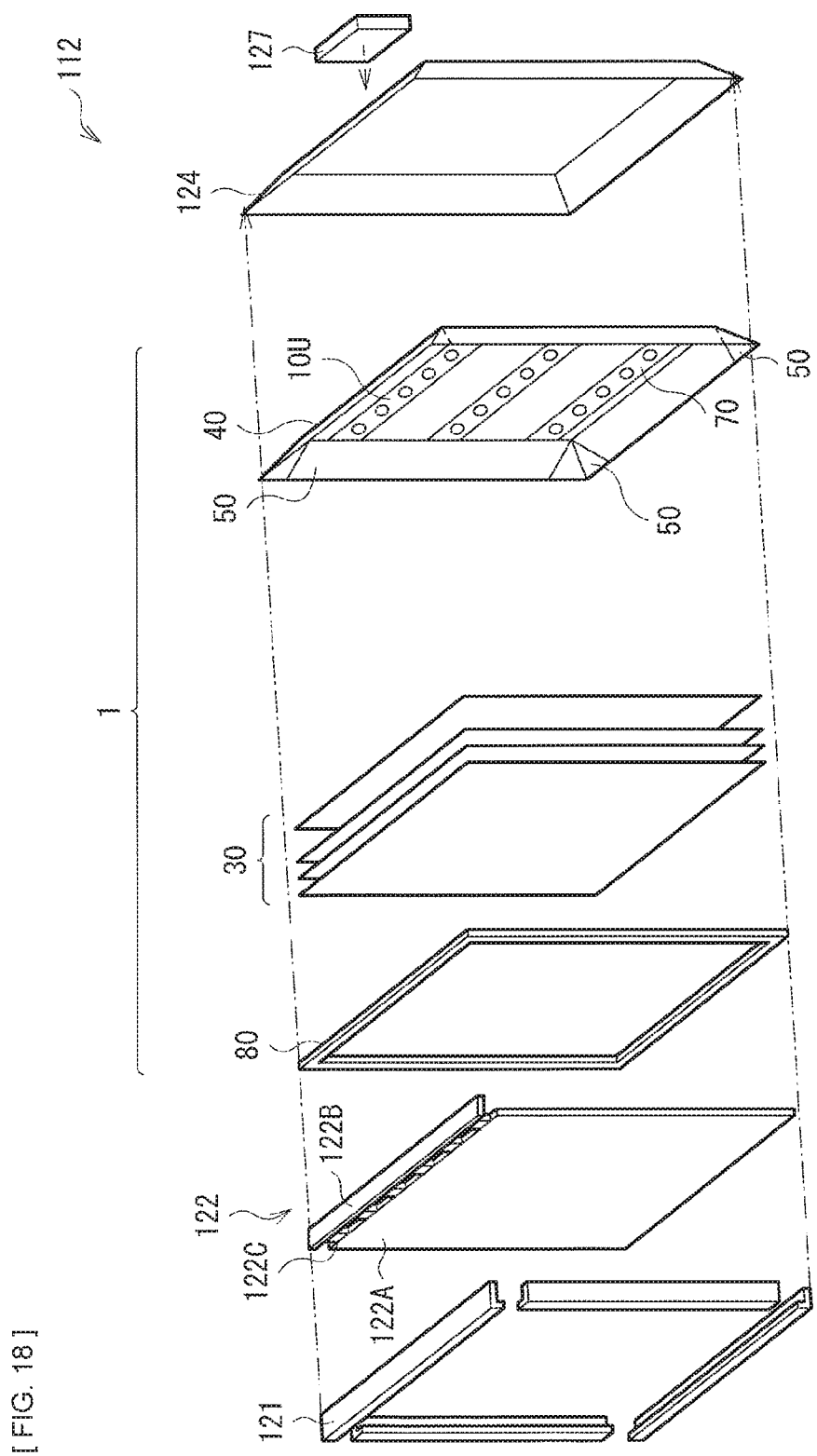
[FIG. 18]

[ FIG. 19A ]
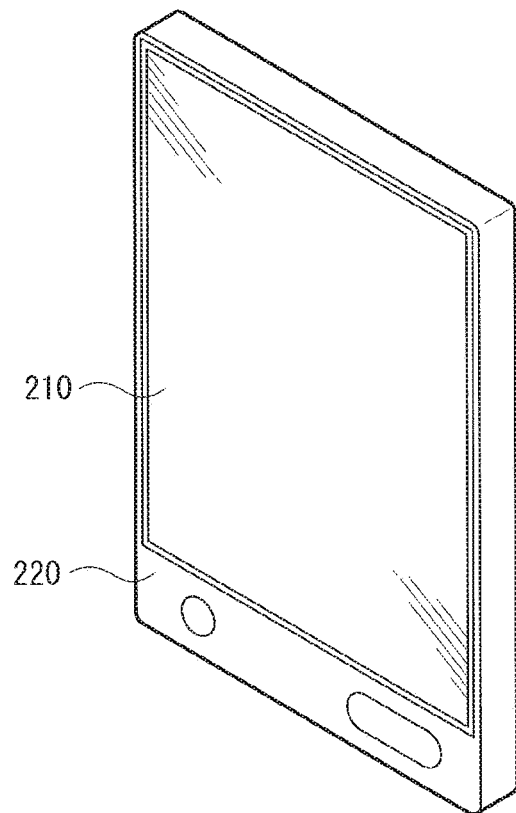
[ FIG. 19B ]
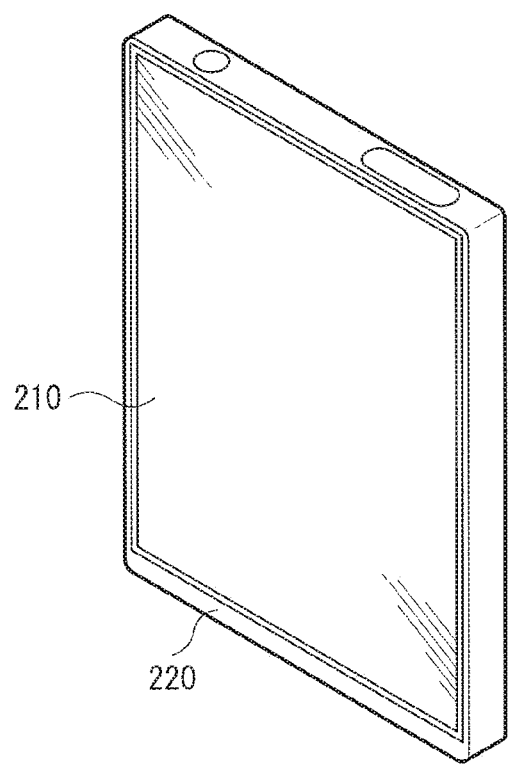

[ FIG. 20 ]
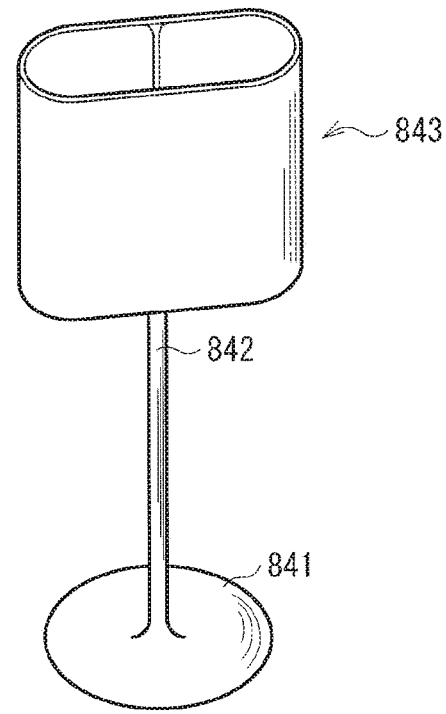
[ FIG. 21 ]
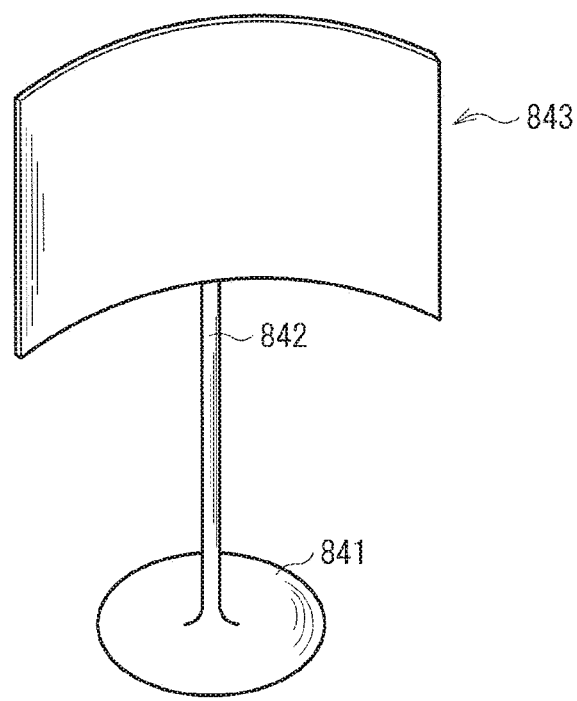

[ FIG. 22 ]
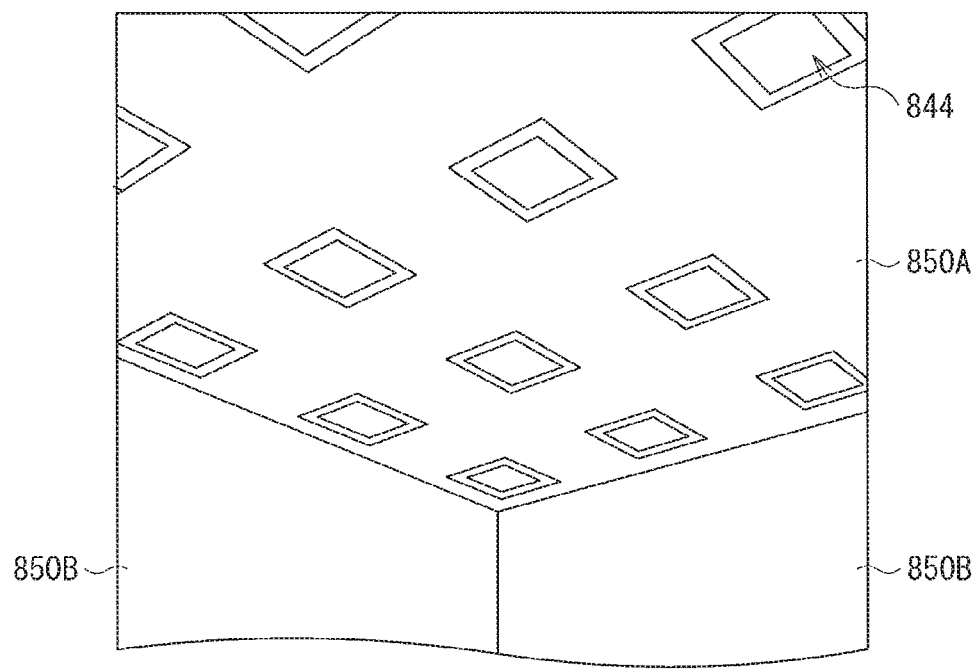

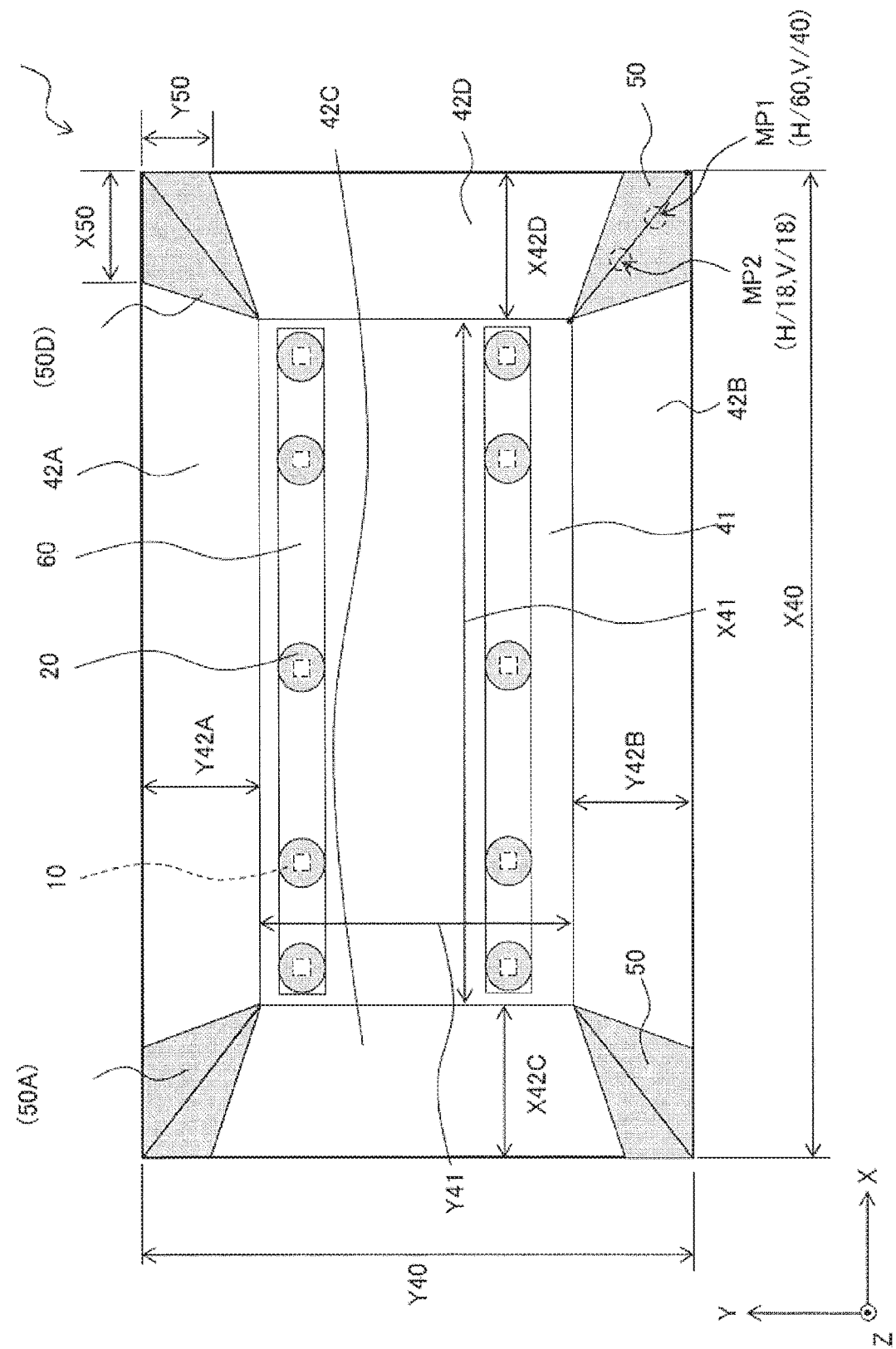
[FIG. 23]

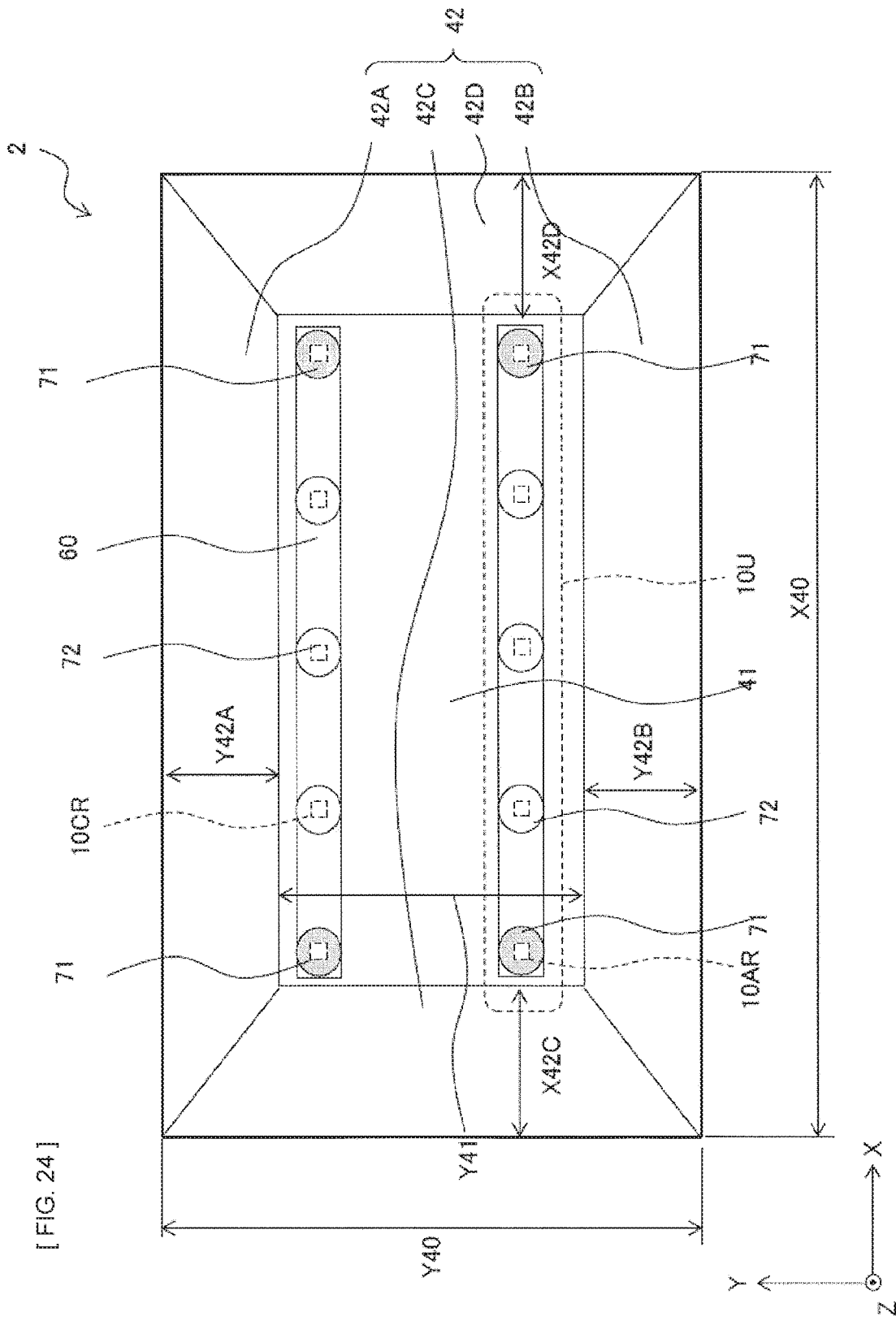
[FIG. 24]

[ FIG. 25 ]
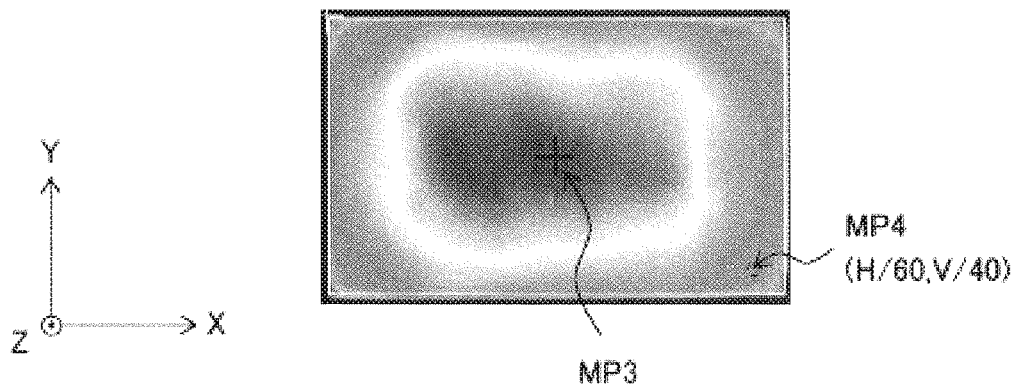
[ FIG. 26 ]
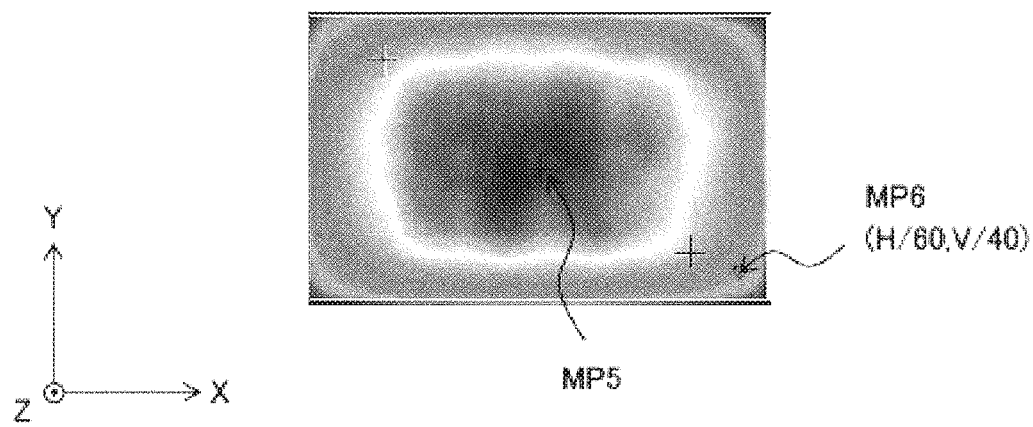
[ FIG. 27 ]
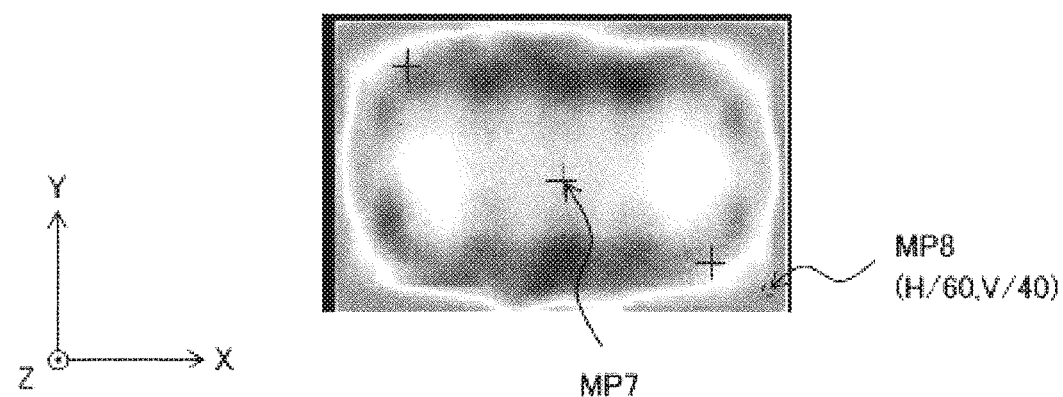

[FIG. 28]
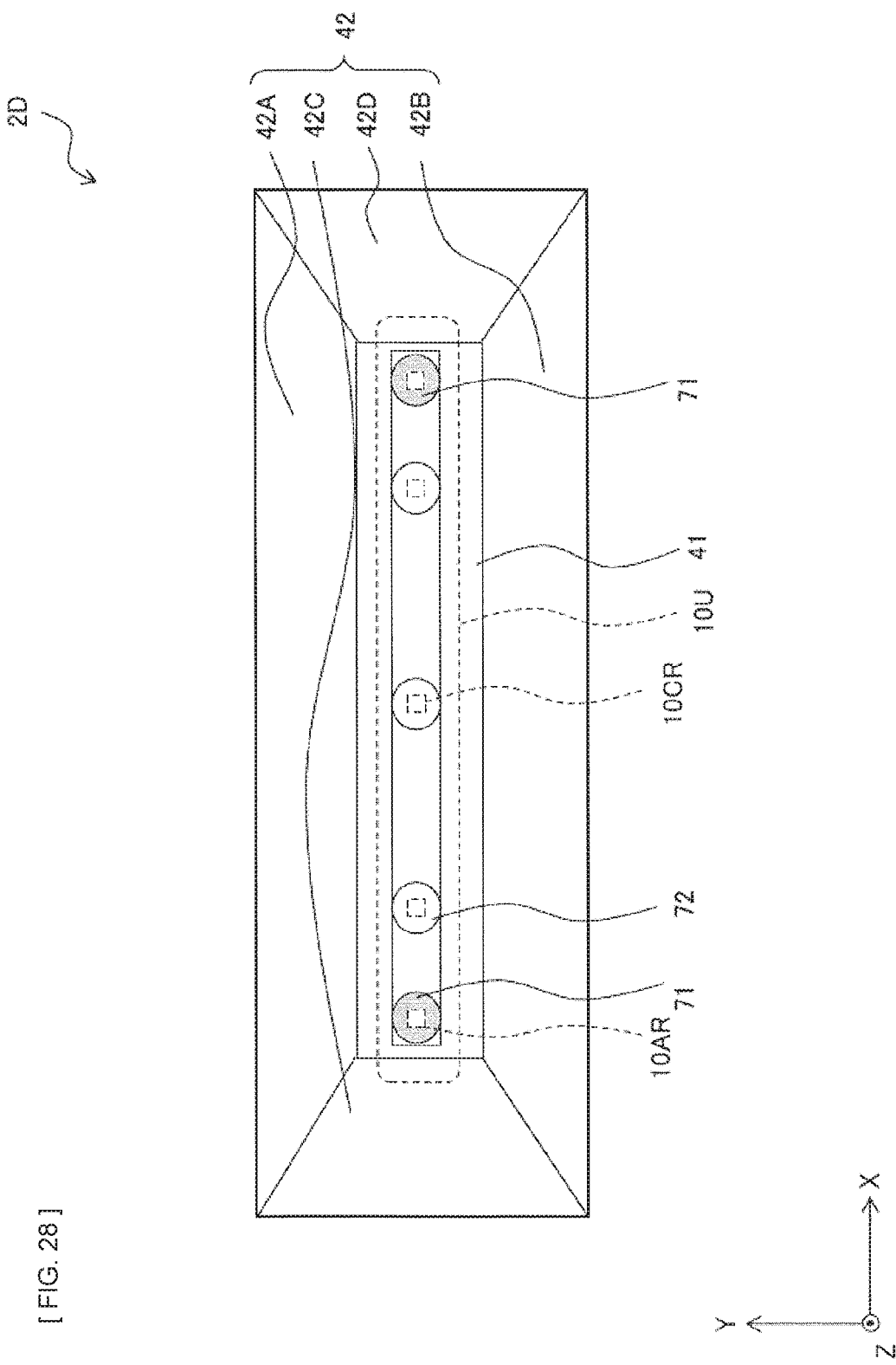

LIGHT-EMITTING DEVICE, DISPLAY APPARATUS AND LIGHTING APPARATUS

CROSS-REFERENCE TO RELATED APPLICATIONS

The present application is a continuation of U.S. patent application Ser. No. 15/750,537, filed Feb. 6, 2018, which application is a national phase entry under 35 U.S.C. § 371 of International Application No. PCT/JP2016/069928, filed Jul. 5, 2016, which claims priority from Japanese Patent Application No. 2015-167267, filed Aug. 26, 2015, all of which are incorporated herein by reference.

TECHNICAL FIELD

The disclosure relates to a light-emitting device, and to a display apparatus and a lighting apparatus that include such a light-emitting device.

BACKGROUND ART

A light-emitting device that uses an LED (Light Emitting Diode) as a light source is adopted in a backlight of a liquid crystal display apparatus, a lighting apparatus, and so forth. For example, PTL 1 discloses a so-called direct-type backlight provided with a plurality of the LEDs disposed on a substrate and with wide-angle lenses disposed above the respective LEDs.

CITATION LIST

Patent Literature

PTL 1: Japanese Unexamined Patent Application Publication No. 2014-13744

SUMMARY OF THE INVENTION

Incidentally, nowadays, a reduction in the number of light sources is further promoted from the viewpoints of thinning of the display apparatus and the lighting apparatus and of a reduction in the number of components. However, in an existing structure, when further thinning and the reduction in the number of the light sources are made in the future, there is a possibility that light from the light source may not be sufficiently diffused through a lens, causing an in-plane luminance unevenness to occur.

It is therefore desirable to provide a light-emitting device with reduced in-plane luminance variation, and a display apparatus and a lighting apparatus that include such a light-emitting device.

A first light-emitting device according to an embodiment of the disclosure includes a main substrate, a plurality of light sources, a plurality of lenses, and one or more light reflection members. The main substrate includes a central part and a peripheral part that surrounds the central part. The plurality of light sources are each disposed on the central part of the main substrate. The plurality of lenses are disposed to correspond to the plurality of light sources respectively. The plurality of lenses apply optical effects to beams of light from the plurality of light sources respectively. One or more light reflection members are each disposed on the peripheral part. The light reflection members each have reflectance that is higher than the reflectance of the main substrate. In addition, a first display apparatus and a first lighting apparatus according to respective embodiments of the disclosure each include the above-described first light-emitting device.

In the first light-emitting device according to an embodiment of the disclosure, one or more light reflection members that each have the reflectance that is higher than the reflectance of the main substrate are provided on the peripheral part of the main substrate, thus alleviating an in-plane luminance deviation even in a case where the number of the light sources is reduced.

A second light-emitting device according to an embodiment of the disclosure includes a main substrate, a plurality of light sources, a first lens, and a second lens. The plurality of light sources are each provided on the main substrate. The first lens is provided to correspond to a first light source of the plurality of light sources. The first lens has a first shape. The second lens is provided to correspond to a second light source of the plurality of light sources. The second lens has a second shape that is different from the first shape. In addition, a second display apparatus and a second lighting apparatus according to respective embodiments of the disclosure each include the above-described second light-emitting device.

In the second light-emitting device according to an embodiment of the disclosure, the first lens and the second lens that are different from each other in shape are provided to correspond to the respective light sources, thus alleviating the in-plane luminance deviation even in the case where the number of the light sources is reduced.

According to the light-emitting device of an embodiment of the disclosure, it is possible to emit light having higher uniformity in an emission surface while mounted with a smaller number of the light sources. That is, it is possible to efficiently emit light with reduced luminance unevenness and reduced color deviation in the emission surface. Therefore, according to a display apparatus using this light-emitting device, it is possible to exhibit excellent display performance. In addition, according to a lighting apparatus using this light-emitting device, it is possible to perform more homogeneous illumination on an object. It is to be noted that the effects of the disclosure are not limited to those described above, and may be any of effects that are described in the following.

BRIEF DESCRIPTION OF THE DRAWINGS

FIG. 1 is a perspective view of an overall configuration example of a light-emitting device according to a first embodiment of the disclosure.

FIG. 2 is a cross-sectional view of a configuration example of a main part of the light-emitting device illustrated in FIG. 1.

FIG. 3 is a plan view of the overall configuration example of the light-emitting device illustrated in FIG. 1.

FIG. 4 is an enlarged cross-sectional view of a configuration example of a peripheral part of a main substrate and a portion of a reflection member illustrated in FIG. 3.

FIG. 5A is an enlarged plan view of a main part of a light-emitting device according to a first modification example (Modification Example 1-1) of the first embodiment.

FIG. 5B is a cross-sectional view of a portion of the light-emitting device illustrated in FIG. 5A.

FIG. 5C is a cross-sectional view of workings of the light-emitting device illustrated in FIG. 1.

FIG. 6 is an enlarged cross-sectional view of a main part of a light-emitting device according to a second modification example of the first embodiment (Modification Example 1-2).

FIG. 7 is a plan view of an overall configuration example of a light-emitting device according to a third modification example of the first embodiment (Modification Example 1-3).

FIG. 8 is a. plan view of an overall configuration example of a light-emitting device according to a fourth modification example of the first embodiment (Modification Example 1-4).

FIG. 9 is a plan view of an overall configuration example of a light-emitting device according to a fifth modification example of the first embodiment (Modification Example 1-5).

FIG. 10 is a perspective view of an overall configuration example of a light-emitting device according to a second embodiment of the disclosure.

FIG. 11 is a cross-sectional view of a configuration example of a main part of the light-emitting device illustrated in FIG. 10.

FIG. 12 is a plan view of an overall configuration example of a light-emitting device according to a first modification example of the second embodiment (Modification Example 2-1).

FIG. 13 is a plan view of an overall configuration example of a light-emitting device according to a second modification example of the second embodiment (Modification Example 2-2).

FIG. 14 is a cross-sectional view of a portion of the light-emitting device illustrated in FIG. 13A.

FIG. 15 is a plan view of an overall configuration example of a light-emitting device according to a third modification example of the second embodiment (Modification Example 2-3).

FIG. 16 is a perspective view of an external appearance of a display apparatus according to a third embodiment of the disclosure.

FIG. 17 is an exploded perspective view of a main body illustrated in FIG. 16.

FIG. 18 is an exploded perspective view of a panel module illustrated in FIG. 17.

FIG. 19A is a perspective view of an external appearance of tablet terminal apparatus (Application Example 1) mounted with the display apparatus according to the disclosure.

FIG. 19B is a perspective view of an external appearance of another tablet terminal apparatus (Application Example 2) mounted with the display apparatus according to the disclosure.

FIG. 20 is a perspective view of an external appearance of a first lighting apparatus (Application Example 3) provided with the light-emitting device according to the disclosure.

FIG. 21 is a perspective view of an external appearance of a second lighting apparatus (Application Example 4) provided with the light-emitting device according to the disclosure.

FIG. 22 is a perspective view of an external appearance of a third lighting apparatus (Application Example 5) provided with the light-emitting device according to the disclosure.

FIG. 23 is a plan view of a light-emitting device in Experimental Example 1-1.

FIG. 24 is a plan view of a light-emitting device in Experimental Example 2-1.

FIG. 25 is a characteristic diagram illustrating a luminance distribution across a light emission region in Experimental Example 2-1.

FIG. 26 is a characteristic diagram illustrating the luminance distribution across the light emission region in Experimental Example 2-2.

FIG. 27 is a characteristic diagram illustrating the luminance distribution across the light emission region in Experimental Example 2-3.

FIG. 28 is a plan view of an overall configuration example of another modification of the light-emitting device according to the disclosure.

MODES FOR CARRYING OUT THE INVENTION

In the following, embodiments of the disclosure are described in detail with reference to the drawings. It is to be noted that description is given in the following order.
1. First Embodiment
   A light-emitting device in which a high-reflection member is disposed on a peripheral part of a main substrate
2. Modification Examples of First Embodiment
3. Second Embodiment
   A light-emitting device using two or more lenses
4. Modification Examples of Second Embodiment
5. Third Embodiment (Display Apparatus; Liquid Crystal Display Apparatus)
6. Application Examples of Display Apparatus
7. Application Examples of Lighting apparatus
8. Experimental Examples

1. FIRST EMBODIMENT

[Configuration of Light-Emitting Device 1]

FIG. 1 is a perspective view of an overall configuration of a light-emitting device 1 according to a first embodiment of the disclosure. FIG. 2 is an enlarged cross-sectional view of a main part of the light-emitting device 1. FIG. 3 is a plan view of an internal configuration of the light-emitting device 1. The light-emitting device 1 is used, for example, as a backlight that illuminates a transmissive liquid crystal panel from behind or as a lighting apparatus in a room, and so forth. It is to be noted that FIG. 3 illustrates a state where an optical sheet 30 described later is removed to allow for visual confirmation of the inside of the light-emitting device 1. In addition, FIG. 2 corresponds to a cross-section in an arrow direction along a line II-II illustrated in FIG. 3. In addition, FIG. 4 is a cross-sectional view of a cross-section in an arrow direction along a line IV-IV illustrated in FIG. 3.

The light-emitting device 1 has, for example, a plurality of light sources 10 (omitted in FIG. 1; refer to FIG. 2 and FIG. 3), a lens 20, an optical sheet 30, a back chassis 40, a light reflection member 50, a light source substrate 60, and a reflection sheet 70 (omitted in FIG. 1 and FIG. 3; refer to FIG. 2 and FIG. 4).

In the specification, it is assumed that a direction of a distance connecting the light source 10 to the optical sheet 30 is a Z direction (a front-back direction), a left-right direction on principal planes of the back chassis 40 and the optical sheet 30 (a widest plane in each of the principal planes) is an X-direction, and a top-bottom direction is a Y-direction. The light-emitting device 1 has, for example, a rectangular planar shape on an XY plane, and a portion or the whole of the principal plane of the optical sheet 30 having the rectangular planar shape functions as an emission surface. Accordingly, the light-emitting device 1 has a rectangular light emission region.

(Back Chassis 40)

The back chassis 40 is a substantially plate-shaped member that includes, for example, a flat central part 41 and peripheral parts 42 (42A to 42D). The peripheral parts 42 are disposed to surround the central part 41 and are inclined relative to the central part 41. The back chassis 40 is covered with the reflection sheet 70 and configures a main substrate. The central part 41 has a rectangular planar shape in which, for example, the X-direction is set as a longitudinal direction. An outer edge of the peripheral part 42 also assumes a rectangular shape in planar view (refer to FIG. 3). The peripheral part 42A and the peripheral part 42B face each other with the central part 41 being interposed therebetween in the Y-direction, and each extend in the X-direction along a long side of the central part 41. The peripheral part 42C and the peripheral part 42D face each other with the central part 41 being interposed therebetween in the X-direction, and each extend in the Y-direction along a short side of the central part 41. An inner surface 42S of the peripheral part 42 is inclined to form an angle θ (for example, 15 degrees) relative to an inner surface 41S of the central part 41.

Examples of constituent materials of the back chassis 40 include resin materials as follows, in addition to metal materials such as SECC (iron) and aluminum. Examples of the resin materials to be used in the back chassis 40 include acrylic resins such as a polycarbonate resin and PMMA (polymethylmethacrylate resin), polyester resins such as polyethylene terephthalate, amorphous copolymer polyester resins such as MS (a copolymer of methyl methacrylate and styrene), polystyrene resins, and polyvinyl chloride resins.

(Light Source 10)

The plurality of light sources 10 are provided and are arranged, for example, in matrix on the central part 41 of the back chassis 40. Each light source 10 is, for example, a point light source that has an optical axis CL in a direction (Z direction) that is orthogonal to the inner surface 41S of the central part 41, and is specifically configured by an LED (Light Emitting Diode) that oscillates white light. The plurality of light sources 10 are disposed to be arranged side by side in the X-direction on one light source substrate 60 to form one light source unit 10U. The light source substrate 60 extends, for example, in the X-direction on the central part 41 of the back chassis 40. FIG. 1 and FIG. 3 each illustrate an example in which three light source units 10U are installed to be arranged side by side in the Y-direction on the central part 41 of the back chassis 40. However, in the technology, the number of the light source units 10U is not limited thereto, and either may be two or less or may be four or more. The light source substrate 60 is provided with a plurality of drive circuits 61 (refer to FIG. 2) at corresponding positions of the plurality of light sources 10 that are each disposed on the substrate 60. The drive circuits 61 drive, for example, the light sources 10. The light source substrates 60 of the respective light source units 10U are each fixed to the inner surface 41S of the central part 41 of the back chassis 40. In addition, as illustrated in FIG. 3, in a certain light source unit 10U, for example, a distance D1 between the light source 10A and the light source 10B that are mutually adjacent at a position near a middle position of the central part 41 in the X-direction may be made larger than a distance D2 between the light source 10A and the light source 10C that are mutually adjacent at a position near both ends of the central part 41 in the X-direction. This is because much light reaches the vicinity of the middle of the central part 41 than the vicinity of an outer edge of the central part 41 from the light sources 10, thus leading to a possibility of an increased difference between a luminance in the vicinity of the middle of the central part 41 and a luminance in the vicinity of the outer edge of the central part 41 (uniformity of the luminance may be reduced), for example, when the distance D1 is made equal to the distance D2. That is, the luminance distribution of emitted light obtained from the light-emitting device 1 may be further flattened by allowing an arrangement density of the light sources 10 in the vicinity of the outer edge of the central part 41 to be higher than that in the vicinity of the middle of the central part 41.

(Lens 20)

The lens 20 is disposed on each of the optical axes CL above the respective light sources 10. The lens 20 is, for example, a reflective lens, and has optical effects. The optical effects include reflecting light L1 incident from the light source 10 at a lens surface 20S that is located on side opposite to the light source 10, and diffusing the light to the surroundings. The lens 20 may be present at a position where the lens 20 overlaps the inner surface 42S of the peripheral part 42 in a direction that is parallel to the inner surface 41S. That is, a distance $H_2O$ from an upper end 20T of the lens 20 to the inner surface 41S is smaller than a distance H30 between a lower surface 30S of the optical sheet 30 and the inner surface 41S.

(Reflection Sheet 70)

The reflection sheet 70 is provided to cover, for example, the back chassis 40 and the light source substrate 60 that is provided on the back chassis 40. The reflection sheet 70 has a function of applying optical effects such as reflection, diffusion, and scattering (in the following, referred to as the reflection, and so forth), for example, to the incident light. The reflection sheet 70 is configured by, for example, foamed PET (polyethylene terephthalate), and so forth.

(Light Reflection Member 50)

As illustrated in FIG. 4, the light reflection member 50 is a sheet-shaped or a film-shaped member that is provided, for example, on the peripheral part 42, with the reflection sheet 70 being interposed therebetween; a surface 50S thereof (refer to FIG. 4) has a function of regular reflection (specular reflection). Specifically, it is preferable that the reflection member 50 may have a surface having a reflectance that is higher than that of the reflection sheet 70 that covers the back chassis 40. The back chassis 40 is subjected to a treatment such as silver vapor deposition, aluminum vapor deposition, and multilayer film reflection. The light reflection members 50 may be provided at positions corresponding to, for example, four corners of the rectangular emission surface of the light-emitting device 1 on the peripheral part 42 of the back chassis 40. More specifically, the light-emitting device 1 includes a light reflection member 50A, a light reflection member 50B, a light reflection member 50C, and a light reflection member 50D as illustrated in FIG. 3. The light reflection member 50A is provided in the vicinity of a boundary between the peripheral part 42A and the peripheral part 42C. The light reflection member 50B is provided in the vicinity of a boundary between the peripheral part 42C and the peripheral part 42B. The light reflection member 50C is provided in the vicinity of a boundary between the peripheral part 42B and the peripheral part 42D. The light reflection member 50D is provided in the vicinity of a boundary between the peripheral part 42D and the peripheral part 42A.

(Optical Sheet 30)

The optical sheet 30 is provided to face the inner surface 41S and the inner surface 42S of the back chassis 40, and includes, for example, a diffusion plate 31, a diffusion sheet 32, and a lens film 33. The optical sheet 30 may further include a polarized light reflection sheet, and so forth. The optical sheet 30 is supported by the outer edge of the peripheral part 42. Owing to provision of such an optical sheet 30, it becomes possible to diffuse the light that is outputted from the light source 10 via the lens 20 and to raise the light further in a front direction, thus making it possible to increase the uniformity of the luminance and a front luminance. In addition, in the light-emitting device 1, a wavelength conversion sheet may be provided between the optical sheet 30 and the lens 20.

[Workings and Effects of Light-Emitting Device 1]

The light source 1 is the point light source, and thus the light from the light source 1 travels from a light emission point of the light source 1 toward the lens 2 while spreading in all directions. The light is reflected at the reflection surface 20S of the lens 2, then is subjected to the optical effects such as the reflection, and so forth at the inner surface 41S of the central part 41 and the inner surface 42S of the peripheral part 42, and further travels toward the optical sheet 30. In addition, a portion of the light reflected at the reflection surface 20S of the lens 2 is reflected at the surface 50S of the light reflection member 50 that is provided on the peripheral part 42, and then travels toward the optical sheet 30. The light traveling toward the optical sheet 30 finally passes through the optical sheet 30, and is observed as emitted light on the outside of the optical sheet 30 (on side opposite to the light source 1). Here, in the light-emitting device 1 according to the embodiment, the light reflection member 50 having a higher reflectance is provided on the peripheral part 42 of the back chassis 40. This allows reduction in emission luminance on the four corners of the rectangular emission surface (XY plane) to be compensated for by reflection of light from the light reflection member 50, thus alleviating a luminance deviation across the rectangular emission surface. Accordingly, in the light-emitting device 1, it is possible to reduce the number of the light sources 10 to be mounted on the light-emitting device 1 while promoting homogeneity of the luminance distribution on the rectangular emission surface.

According to the light-emitting device 1, it is possible to emit the light having higher uniformity in the emission surface in this way. That is, it is possible to efficiently emit the light having less luminance unevenness and less color deviation in the emission surface. Consequently, it is possible to exhibit an excellent display performance by using the light-emitting device 1 in a display apparatus. In addition, it is possible to perform more homogeneous illumination on the object by using the light-emitting device 1 in a lighting apparatus.

2. MODIFICATION EXAMPLES OF FIRST EMBODIMENT

2-1. Modification 1-1

(Configuration of Light-Emitting Device 1A)

Next, the light-emitting device 1A according to a first modification example of the above-described first embodiment is described with reference to FIG. 5A and FIG. 5B. FIG. 5A is an enlarged plan view of a main part of the light-emitting device 1A, and FIG. 5B is a partial cross-sectional view along line VB-VB illustrated in FIG. 5A.

In the light-emitting device 1A according to the modification example, an end 50L of the light reflection member 50 is covered with an end 73L of the reflection sheet 70 that covers the inner surface 42S of the peripheral part 42 of the back chassis 40. The light-emitting device 1A has a configuration that is substantially similar to that of the light-emitting device 1 according to the first embodiment, except for this point. Specifically, the light reflection members 50 are disposed at positions corresponding to the four corners of the emission surface of the light-emitting device 1A on the peripheral part 42, and the end 70L of the reflection sheet 70 is provided to cover the end 50L of the light reflection member 50.

(Workings and Effects of Light-Emitting Device 1A)

In the light-emitting device 1A, the end 50L of the light reflection member 50 is covered with the end 70L of the reflection sheet 70, thus making it possible to prevent light L emitted from the light source 10 from entering an end face 50T of the light reflection member 50. However, the light-emitting device 1 according to the above-described first embodiment is provided with the light reflection member 50 on the reflection sheet 70. Therefore, the end face 50T of the light reflection member 50 is in an exposed state, for example, as illustrated in FIG. 5C. Accordingly, a portion of the light L emitted from the light source 10 enters the end face 50T of the light reflection member 50. Thus, there are cases where a dark line is visually confirmed at a position corresponding to the end face 50T, on the emission surface of the light emitting device 1. In contrast, in the present modification example, the end face 50T is not irradiated with the light L. Therefore, it is possible to prevent generation of the dark line on the emission surface, thus allowing for further improvement in flatness of the luminance distribution emitted from the emission surface.

2-2. Modification Example 1-2

FIG. 6 is an enlarged cross-sectional view of a main part of a light-emitting device 1B according to a second modification example of the above-described first embodiment. In the light-emitting device 1B, the reflection sheet 70 is provided to cover the inner surface 42S of the peripheral part 42, and an end face of the reflection sheet 70 is brought into abutment on the end face of the light reflection member 50. The light-emitting device 1B has a configuration that is substantially similar to that of the light-emitting device 1 according to the above-described first embodiment, except for this point. Also in the light-emitting device 1B according to the present modification example, it is possible to prevent generation of the dark line on the emission surface, thus allowing for further improvement in the flatness of the luminance distribution emitted from the emission surface.

2-3. Modification Examples 1-3 to 1-5

FIG. 7 to FIG. 9 are plan views, respectively, of light-emitting devices 1C to 1E according to corresponding third to fifth modification examples of the above-described first embodiment. Although, the light-emitting device 1 according to the first embodiment is provided with the light reflection members 50 on the four corners of the light emission region, the disclosure is not limited thereto.

For example, as in the light-emitting device 1C according to the third modification example illustrated in FIG. 7, the light reflection member 50 may be provided on a portion or the entire of a region (a shaded region in FIG. 7) that surrounds the light sources 10 disposed on the central part 41. In this case, for example, when a maximum value of intervals between the light sources that are mutually adjacent in the X-direction and the Y-direction is P, the light reflection member 50 may be provided in a region (a peripheral region) that is apart from all the light sources 10 by P/2 or more. When an intensity of light that reaches a position that is apart from one light source 10 by P/2 from that one light source 10 is set as PW, light of an intensity that is not less than PW will reach a region (a central region) other than the peripheral region from one or more light sources 10. However, in a case where the light reflection member 50 is not disposed, the intensity of light that reaches the peripheral region becomes less than PW. In the light-emitting device 1C, it is possible to compensate for the intensity of the light that reaches the peripheral region by disposing the light reflection member 50 as illustrated in FIG. 7. Consequently, in the light-emitting device 1C, it is possible to further improve the flatness of the luminance distribution emitted from the emission surface.

In addition, as in the light-emitting device 1D according to the fourth modification example illustrated in FIG. 8, the occupation area of the upper peripheral part 42A may be made larger than the occupation area of each of other peripheral parts 42B to 42D, thus providing the light reflection member 50 only on the peripheral part 42A.

Alternatively, as in the light-emitting device 1E according to the fifth modification example illustrated in FIG. 9, the occupation areas of the left and right peripheral parts 42C and 42D may be made larger than the occupation areas of the upper and lower peripheral parts 42A and 42B, thus providing the light reflection members 50 only on the peripheral parts 42C and 42D.

3. SECOND EMBODIMENT

[Configuration of Light-Emitting Device 2]

FIG. 10 is a plan view of an overall configuration of the light-emitting device 2 according to a second embodiment of the disclosure. In addition, FIG. 11 is an enlarged cross-sectional view of a main part of the light-emitting device 2, and corresponds to a cross-section in an arrow direction along a line XI-XI illustrated in FIG. 10. The light-emitting device 2 has a configuration that is substantially similar to that of the light-emitting device 1 according to the above-described first embodiment, except for a point that two lenses 71 and 72 of mutually different shapes are used in place of provision of the light reflection members 50. Accordingly, in the following description, the same reference numerals are used for constitutional elements that are substantially the same as those of the light-emitting device 1 in the light-emitting device 2, and description thereof is omitted where appropriate.

Specifically, in the light emitting device 2, the lenses 71 are disposed to correspond to respective light sources 10AR, of the plurality of light sources 10, located on the four corners of the central part 41. The lenses 72 are disposed to correspond to respective light sources 10CR other than the light sources 10AR of the plurality of light sources 10. Both of the lens 71 and the lens 72 apply the optical effects to the light incident from the light sources 10. However, spreading of light L71, on the XY plane, that enters the lens 71, is reflected at a surface 71S, and then is outputted from the lens 71 is larger than spreading of light L72, on the XY plane, that enters the lens 72 and then is outputted from a surface 72S of the lens 72. That is, the lens 71 is able to diffuse the light from the light source 10 in a wider range than the lens 72. The lens 71 is a reflective lens that diffuses the light from, for example, the light source 10AR along the inner surface 41S of the central part 41 and outputs the light L71. The lens 72 is a refractive lens that refracts the light from, for example, the light source 10CR to travel toward side opposite to the central part 41 (toward the optical sheet 30) to output the light L72.

[Workings and Effects of Light-Emitting Device 2]

In the light-emitting device 2, the lenses 71 and 72 having the mutually different shapes are appropriately selected and disposed in accordance with the positions of the light sources 10 that face the lenses in this way. Therefore, it is possible to promote optimization of the luminance distribution in the light emission region by utilizing the spreading of the light L71 and the light L72 that are outputted via the lenses 71 and 72, respectively. Specifically, in the light-emitting device 2, it is possible to alleviate the reduction in luminance in the peripheral region relative to the luminance in the central region of the light emission region by disposing the reflective lenses 71 on the four corners of the light emission region. Thereby, the luminance deviation across the rectangular emission surface is alleviated. Accordingly, also in the light-emitting device 2, it is possible to reduce the number of the light sources 10 to be mounted on the light-emitting device 2 while promoting the homogenization of the luminance distribution on the rectangular emission surface, similarly to the light-emitting device 1. Further, owing to installation of the refractive lenses 72 in addition to the reflective lenses 71, it is possible to improve the luminance of the light emitted from the overall light mission surface of the light-emitting device 2, thus making it possible to increase luminous efficiency, in comparison with a case where the lenses are configured only by the reflective lenses.

4. MODIFICATION EXAMPLES OF SECOND EMBODIMENT

4-1. Modification Example 2-1

Next, a light-emitting device 2A according to a first modification example of the above-described second embodiment is described with reference to FIG. 12. FIG. 12 is a plan view of an overall configuration of the light-emitting device 2A. In the light-emitting device 2A according to the present modification example, the plurality of lenses 71 are provided to surround the plurality of lenses 72 that are provided in a region surrounded by a broken line. In the light-emitting device 2A, it is possible to further alleviate the lowering of luminance in the peripheral region relative to the luminance of the central region of the light emission region.

4-2. Modification Example 2-2

Next, a light-emitting device 2B according to a second modification example of the above-described second embodiment is described with reference to FIG. 13. FIG. 13 is a plan view of an overall configuration of the light-emitting device 2B. In addition, FIG. 14 is an enlarged cross-sectional view of a main part of the light-emitting device 2B, and corresponds to a cross-section in an arrow direction along a line XIV-XIV illustrated in FIG. 13. The light-emitting device 2B according to the present modification example further has a lens 73 having a shape that is different from any of the shape of the lens 71 and the shape of the lens 72. Specifically, the light-emitting device 2B has the four lenses 71 that are disposed on the respective four corners of the central part 41, the plurality of lenses 73 that are each disposed at a position interposed between the two adjacent lenses 71, and the plurality of lenses 72 that are each surrounded by the lenses 71 and the lenses 73. Here, the lens 73 diffuses the light from the light source 10 in a wider range than the lens 72. However, light L73 that is outputted from a surface 73S of the lens 73 remains in a range that is narrower than that of the light L71 that is reflected from the surface 71S of the lens 71 and then is outputted.

4-3. Modification Example 2-3

FIG. 15 is a plan view of an overall configuration of a light-emitting device 2C according to a third modification of the above-described second embodiment. The light-emitting device 2C has a configuration that is similar to that of the light-emitting device 2 according to the above-described second embodiment, except for arrangement of the light reflection members 50 on the four corners. According to the light-emitting device 2C, it is possible to further increase the luminance in regions of the four corners, on the emission surface, which are each least likely to receive the light from the light source 10.

5. THIRD EMBODIMENT

FIG. 16 illustrates an external appearance of a display apparatus 101 according to a third embodiment of the technology. The display apparatus 101 is used as a thin television provided with, for example, the light-emitting device 1, and has a configuration in which a plate-shaped main body 102 for image display is supported by a stand 103. It is to be noted that the display apparatus 101 may be provided with any of the light-emitting devices 1A to 1C, 2, and 2A to 2C in place of the light-emitting device 1. In addition, the display apparatus 101 is installed on a horizontal plane such as a floor, a rack, and a stand, and is used as the stationary-type one, with the stand 103 being attached to the main body 102. However, it is also possible to use the display apparatus 101 as the wall-mounted type one, with the stand 103 being detached from the main body 102.

FIG. 17 illustrates the main body 102 illustrated in FIG. 16 in an exploded state. The main body 102 includes, for example, from front side (viewer side), a front exterior member (a bezel) 111, a panel module 112, and a rear exterior member (a rear cover) 113 in this order. The front exterior member 111 is a frame-shaped member that covers a front peripheral part of the panel module 112, and a pair of speakers 114 is disposed at the lower part thereof. The panel module 112 is fixed to the front exterior member 111, and a power source substrate 115 and a signal substrate 116 are mounted on a rear surface of the panel module 112, with a metal fitting 117 being fixed to the rear surface. The metal fitting 117 is used for fitting of a wall-mounted bracket, fitting of the substrate and so forth, and fitting of the stand 103. The rear exterior member 113 covers the rear surface and side faces of the panel module 112.

FIG. 18 illustrates the panel module 112 illustrated in FIG. 17 in the exploded state. The panel module 112 includes, from front side (viewer side), a front housing (a top chassis) 121, a liquid crystal panel 122, a frame-shaped member (a middle chassis) 80, the optical sheet 30, the light source unit 10U and the lens 20, the back chassis 40 and the light reflection member 50, a rear housing (a back chassis) 124, and a timing controller substrate 127 in this order, for example.

The front housing 121 is a frame-shaped metal component that covers the front peripheral part of the liquid crystal panel 122. The liquid crystal panel 122 includes, for example, a liquid crystal cell 122A, a source substrate 122B, and a flexible substrate 122C such as a chip on film (COF) that couples these component parts. The frame-shaped member 80 is a frame-shaped resin-made component that holds the liquid crystal panel 122 and an optical sheet 50. The rear housing 124 is a metal component made of iron (Fe) and so forth and accommodates the liquid crystal panel 122 and the light-emitting device 10. The timing controller substrate 127 is also mounted on a rear surface of the rear housing 124.

In the display apparatus 101, image display is performed by causing the liquid crystal panel 122 to selectively transmitting the light from the light-emitting device 10. Here, the display apparatus 101 includes the light-emitting device 1 that achieves improvement in uniformity of the in-plane luminance distribution as described in the first embodiment, thus leading to improvement in the display quality of the display apparatus 101.

6. APPLICATION EXAMPLE OF DISPLAY APPARATUS

In the following, an application example of the display apparatus 101 as described above to electronic apparatuses is described. Examples of the electronic apparatuses include a television, a digital camera, a notebook personal computer, a mobile terminal apparatus such as a mobile phone, and a video camera. In other words, the above-described display apparatus is applicable to electronic apparatuses in every field that display externally inputted image signals or internally generated image signals as images or pictures.

FIG. 19A illustrates an external appearance of a tablet terminal apparatus (Application Example 1) to which the display apparatus 101 of the foregoing embodiment is applicable. FIG. 19B illustrates an external appearance of another tablet terminal apparatus (Application Example 2) to which the display apparatus 101 of the foregoing embodiment is applicable. Each of these tablet terminal apparatuses includes, for example, a display section 210 and a non-display section 220, and the display section 210 is configured by the display apparatus 101 of the foregoing embodiment.

7. APPLICATION EXAMPLES OF LIGHTING APPARATUS

Each of FIGS. 20 and 21 illustrates an external appearance of a tabletop lighting apparatus (Application Examples 3 and 4) to which the light-emitting device 1 of the foregoing embodiment is applicable. Each of these lighting apparatuses includes, for example, an illuminating section 843 attached to a support post 842 that is provided on a base 841. The illuminating section 843 is configured by any of the light-emitting devices 1 and 2 according, respectively, to the foregoing first and second embodiments. It is possible for the illuminating section 843 to take any shape such as a tubular shape illustrated in FIG. 20 and a curved surface shape illustrated in FIG. 21, by configuring components such as a substrate 2, a reflective plate 3, and an optical sheet 4 in curved shapes.

FIG. 22 illustrates an external appearance of an indoor lighting apparatus (Application Example 5) to which the light-emitting device 1 of the foregoing embodiments is applicable. The lighting apparatus includes an illuminating section 844 that is configured by any of the light-emitting devices 1 and 2 according to the foregoing embodiments, for example. The appropriate number of the illuminating sections 844 are disposed at appropriate intervals on a ceiling 850A of a building. It is to be noted that the illuminating section 844 may be installed not only on the ceiling 850A, but also on any location such as a wall 850B or a floor (not illustrated in the diagram) depending on the intended use.

In these lighting apparatuses, illumination is performed through the light from the light-emitting device 10. Here, the lighting apparatuses include the light-emitting device 10 that improves the homogeneity of the in-plane luminance distribution, thus leading to improvement in illumination quality. It is to be noted that these lighting apparatuses may be provided with any of the light-emitting devices 1A to 1C, 2, 2A to 2C in place of the light-emitting device 1.

8. EXPERIMENTAL EXAMPLES

Experimental Example 1-1

A sample of the light-emitting device 1 according to the above-described first embodiment was produced, with the proviso that, as illustrated in FIG. 23, an X-direction (a horizontal direction) dimension X40 and a Y-direction (a vertical direction) dimension Y40 of (an outer edge of the peripheral part 42 of) the back chassis 40 were set to 699 mm and 400 mm, respectively. In addition, an X-direction dimension X41 and a Y-direction dimension Y41 of the central part 41 of the back chassis 40 were set to 492 mm and 185 mm, respectively. In addition, dimensions Y42A, Y42B, X42C, X42D, X50, and Y50 of respective parts illustrated in FIG. 23 were set to 104 mm, 104 mm, 104 mm, 104 mm, 50 mm, and 50 mm, respectively. Further, five pieces each of the light source 10 and the lens 20 were mounted to allow five pieces each thereof to be arranged side by side in the X-direction and two pieces each thereof to be arranged side by side in the Y-direction on the central part 41.

Experimental Example 1-2

A sample of the light-emitting device was produced similarly to Experimental Example 1-1, except for a point that the light reflection member 50 was not provided.

Luminance levels Lv1 and Lv2 to be observed at respective two measurement points MP1 and MP2 were measured for each of the samples of the above-described Experimental Examples 1-1 and 1-2 and ratios (Lv2/Lv1) between the levels were obtained. Results thereof are indicated in Table 1. The measurement point MP1 is a position (H/60, V/40) corresponding to the corner (of the peripheral part 42) of the back chassis 40. The measurement point MP2 is a position (H/18, V/18) corresponding to the corner of the central part 41 of the back chassis 40. It is to be noted Table 1 indicates numerical values obtained by normalizing the luminance level Lv1 in Experimental Example 1-2 as 1.

TABLE 1

|  | Luminance Level | | |
|---|---|---|---|
|  | Lv1 | Lv2 | Lv2/Lv1 |
| Experimental Example 1-1 | 1 | 1.41 | 1.41 |
| Experimental Example 1-2 | 1 | 1.79 | 1.79 |

As indicated in Table 1, it was possible to confirm that, in Experimental Example 1-1, the luminance level was higher at the measurement point MP1 than Experimental Example 1-2 in which the light reflection member 50 was not provided. That is, in Experimental Example 1-1, the light reflection members 50 was disposed on the four corners of the back chassis 40. Therefore, it was confirmed that it was possible to compensate for the luminance level reduction at the measurement point MP1 (H/60, V/40), thus making it possible to alleviate the luminance unevenness across the light emission region.

Experimental Example 2-1

Next, a sample of the light-emitting device 2 according to the above-described second embodiment was produced, provided that, as illustrated in FIG. 24, the X-direction (horizontal direction) dimension X40 and the Y-direction (vertical direction) dimension Y40 of (the outer edge of the peripheral part 42 of) the back chassis 40 were set to 692 mm and 400 mm, respectively. In addition, the X-direction dimension X41 and the Y-direction dimension Y41 on the central part 41 of the back chassis 40 were set to 492 mm and 185 mm, respectively. In addition, the dimensions Y42A, Y42B, X42C, and X42D of the respective parts illustrated in FIG. 24 were all set to 104 mm. Further, the ten light sources 10 were mounted to allow five light sources 10 to be arranged side by side in the X-direction and two light sources 10 to be arranged side by side in the Y-direction on the central part 41. The reflective lenses 71 were disposed to correspond to the respective light sources 10 located at both ends in the X-direction. The refractive lenses 72 were disposed to correspond to the light sources 10 located at respective locations other than both the ends in the X-direction. In addition, intervals between the mutually adjacent lenses were set to be equal.

Experimental Example 2-2

A sample of the light-emitting device was produced as Experimental Example 2-2 similarly to Experimental Example 2-1, except for a point that the reflective lenses 71 were totally replaced with the refractive lenses 72.

Experimental Example 2-3

Further, a sample of the light-emitting device was produced as Experimental Example 2-3 similarly to Experimental Example 2-1, except for a point that the refractive lenses 72 were totally replaced with the reflective lenses 71.

The luminance distributions across the light emission regions of the respective samples of the above-described Experimental Examples 2-1 to 2-3 were measured. Results thereof are illustrated in FIG. 25 to FIG. 27, respectively. In addition, Table 2 indicates results in which luminance levels at measurement points MP3, MP5 and MP7 on the central part of the light emission region and luminance levels at measurement points MP4, MP6 and MP8 (H/60, V/40) on the peripheral part of the light emission region were compared with one another altogether for each of the samples of Experimental Examples 2-1 to 2-3.

TABLE 2

|  | Luminance Level | |
|---|---|---|
|  | Center | Periphery |
| Experimental Example 2-1 | 1 | 0.21 |
| Experimental Example 2-2 | 1.03 | 0.12 |
| Experimental Example 2-3 | 0.69 | 0.29 |

Table 2 indicates numerical values obtained by normalizing the luminance level at the measurement point MP3 at the center of the light emission region of Experimental Example 2-1 as 1. As indicated in Table 2, it was confirmed that according to the technology, it is possible to alleviate the lowering of luminance in the vicinity of the outer edge of the light emission region while maintaining the luminance in the vicinity of the center of the light emission region. That is, although, in Experimental Example 2-2, the luminance at the measurement point MP5 is higher than the luminance at the measurement point MP3 in Experimental Example 2-1, a luminance drop at the measurement point MP6 is very large. In addition, although, in Experimental Example 2-3, the luminance at the measurement point MP8 is higher than the luminance at the measurement point MP4 in Experimental Example 2-1, the luminance drop at the measurement point MP7 was very large. Therefore, it was found that, according to the technology, it is possible to alleviate the lowering of luminance on the peripheral region relative to the central region of the light emission region while maintaining high entire luminance efficiency.

Although the disclosure has been described hereinabove by giving the embodiments, the modification examples and experimental examples, the disclosure is by no means limited to the foregoing embodiments, and so forth, and various modifications are possible. For example, although FIG. 7 illustrates an example in which the plurality of light sources 10 and the plurality of lenses 71 and 72 are disposed in matrix, the disclosure is not limited thereto. For example, only one light source unit 10U may be mounted that has the light sources 10 arranged side by side in one arrangement direction (X-direction), as in the light emitting device 2D illustrated in FIG. 28. In this case, the lenses 71 may be disposed on the both ends in the X-direction, and the lens 72 may be disposed to be interposed between the lenses 71.

In addition, dimensions, dimensional ratios, and shapes of the respective constitutional elements illustrated in each drawing are merely illustrative, and the disclosure is not limited thereto.

Further, for example, in the foregoing embodiments, the description has been given on the case where the light source 10 is an LED; however, the light source 10 may be configured by a semiconductor laser and so forth.

Additionally, for example, in the foregoing embodiments and modification examples, the description has been given by citing, as a specific example, configurations of the light-emitting device 1 and the display apparatus 101 (the television); however, it is unnecessary to provide all of the components, and other components may be provided.

It is to be noted that the effects described herein are merely illustrative and non-limiting, and may further include other effects. Further, the technology may have the following configurations.

(1)
A light-emitting device including:
a main substrate that includes a central part and a peripheral part that surrounds the central part;
a plurality of light sources that are each disposed on the central part of the main substrate;
a plurality of lenses disposed to correspond to the plurality of light sources respectively, the plurality of lenses applying optical effects to beams of light from the plurality of light sources respectively; and
one or more light reflection members that are each disposed on the peripheral part, the light reflection members each having reflectance that is higher than the reflectance of the main substrate.

(2)
The light-emitting device according to (1), in which
the main substrate has a rectangular planar shape in which a first direction is set as a longitudinal direction, and
the light reflection members are each disposed on four corners of the peripheral part of the main substrate.

(3)
The light-emitting device according to (2), in which
the peripheral part includes a first part and a second part that face each other with the central part being interposed therebetween in the first direction, and a third part and a fourth part that face each other with the central part being interposed therebetween in a second direction that is orthogonal to the first direction, and
the light reflection members are each disposed on the first part to the fourth part.

(4)
The light-emitting device according to any one of (1) to (3), further including a light source substrate on which the plurality of light sources are arranged side by side in the first direction, the light source substrate being provided on the central part of the main substrate.

(5)
The light-emitting device according to (4), in which
when a maximum value of intervals between the plurality of light sources that are arranged side by side in the first direction is set as P,
the light reflection members are each provided in a region that is P/2 or more apart from respective central positions of all the light sources.

(6)
A light-emitting device including:
a main substrate;
a plurality of light sources that are each provided on the main substrate;
a first lens that is provided to correspond to a first light source of the plurality of light sources, the first lens having a first shape; and
a second lens that is provided to correspond to a second light source of the plurality of light sources, the second lens having a second shape that is different from the first shape.

(7)
The light-emitting device according to (6), in which
first light that is outputted from the first lens is configured to spread along the main substrate more than second light that is outputted from the second light source.

(8)
The light-emitting device according to (7), in which
the first lens is a reflective lens that diffuses the light from one of the light sources along the main substrate, and
the second lens is a refractive lens that refracts the light from the other of the light sources to direct the light toward side opposite to the main substrate.

(9)
The light emitting device according to (7) or (8), in which
the main substrate has a rectangular planar shape in which a first direction is set as a longitudinal direction, and
the first lens is provided on each of four corners of the main substrate.

(10)
The light-emitting device according to any one of (7) to (9), in which
the plurality of light sources are each disposed in matrix on the main substrate, and
a plurality of the first lenses are provided to surround the second lens.

The light-emitting device according to any one of (7) to (10), in which the main substrate includes a central part on which the plurality of light sources are provided and a peripheral part that surrounds the central part, and the light-emitting device further includes one or more light reflection members each provided on the peripheral part, the light reflection members each having reflectance that is higher than the reflectance of the main substrate.

(12) The light-emitting device according to (11), in which the main substrate has a rectangular planar shape in which a first direction is set as a longitudinal direction, and the light reflection members are each provided on four corners of the peripheral part of the main substrate.

(13) A display apparatus including:

a liquid crystal panel; and a light-emitting device on rear surface side of the liquid crystal panel, the light-emitting device including a main substrate that includes a central part and a peripheral part that surrounds the central part, a plurality of light sources that are each disposed on the central part of the main substrate, a plurality of lenses disposed to correspond to the plurality of light sources respectively, the plurality of lenses applying optical effects to beams of light from the plurality of light sources respectively, and one or more light reflection members that are each disposed on the peripheral part, the light reflection members each having reflectance that is higher than the reflectance of the main substrate.

(14) A display apparatus including:

a liquid crystal panel; and a light-emitting device on rear surface side of the liquid crystal panel, the light-emitting device including a main substrate, a plurality of light sources that are each provided on the main substrate, a first lens that is provided to correspond to one light source of the plurality of light sources and has a first shape, and a second lens that is provided to correspond to the other light source of the plurality of light sources and has a second shape that is different from the first shape.

(15) A lighting apparatus including a light-emitting device, the light-emitting device including a main substrate that includes a central part and a peripheral part that surrounds the central part, a plurality of light sources that are each disposed on the central part of the main substrate, a plurality of lenses disposed to correspond to the plurality of light sources respectively, the plurality of lenses applying optical effects to beams of light from the plurality of light sources respectively, and one or more light reflection members that are each disposed on the peripheral part, the light reflection members each having reflectance that is higher than the reflectance of the main substrate.

(16) A lighting apparatus including a light-emitting device, the light-emitting device including a main substrate, a plurality of light sources that are each provided on the main substrate, a first lens that is provided to correspond to one light source of the plurality of light sources and has a first shape, and a second lens that is provided to correspond to the other light source of the plurality of light sources and has a second shape that is different from the first shape.

The present application is based on and claims priority from Japanese Patent Application No. 2015-167267 filed with the Japan Patent Office on Aug. 26, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display apparatus comprising:
a liquid crystal panel; and
a light-emitting device,
wherein the light-emitting device comprises:
a main substrate that includes a central part and a peripheral part that surrounds the central part;
a plurality of light sources that are disposed on the central part of the main substrate;
a plurality of lenses disposed on the plurality of light sources to cover tops and sides of the light sources, the plurality of lenses applying optical effects to beams of light from the plurality of light sources, respectively;
a reflection sheet that covers the main substrate; and
one or more light reflection members that are disposed over the peripheral part, the light reflection members having reflectance that is higher than the reflectance of the main substrate;
wherein the one or more light reflection members are in the corners of the peripheral part and have reflectance higher than the reflection sheet, the light reflection members each having a central fold line dividing the light reflection members into two separate portions.

2. The display apparatus according to claim 1, wherein the reflection sheet interposes the one or more light reflection members and the peripheral part.

3. The display apparatus according to claim 1, wherein the main substrate has a rectangular planar shape in which a first direction is set as a longitudinal direction.

4. The display apparatus according to claim 1, further comprising at least one light source substrate on which the plurality of light sources are arranged side by side in the first direction, the light source substrate being provided on the central part of the main substrate.

5. The display apparatus according to claim 1, wherein when a maximum value of intervals between the plurality of light sources that are arranged side by side in the first direction is set as P, the light reflection members are provided in a region that is P/2 or more apart from respective central positions of all the light sources.

6. The display apparatus according to claim 1, wherein the plurality of lenses comprises:
at least one of a first lens that is provided to correspond to at least a first light source of the plurality of light sources, the first lens having a first shape; and
at least one of a second lens that is provided to correspond to at least a second light source of the plurality of light sources, the second lens having a second shape that is different from the first shape.

7. The display apparatus according to claim 6, wherein first light that is outputted from the first lens is configured to spread along the main substrate more than second light that is outputted from the second light source.

8. The display apparatus according to claim 7, wherein the first lens is a reflective lens that diffuses the light from one of the plurality of light sources along the main substrate, and
the second lens is a refractive lens that refracts the light from the other of the plurality of light sources to direct the light toward side opposite to the main substrate.

9. The display apparatus according to claim 7, wherein the main substrate has a rectangular planar shape in which a first direction is set as a longitudinal direction, and
the first lens is provided on each of four corners of the main substrate.

10. The display apparatus according to claim 7, wherein the plurality of light sources are disposed in matrix on the main substrate, and
a plurality of the first lenses are provided to surround the second lens.

11. The display apparatus according to claim 1, wherein the light sources are LEDs.

12. The display apparatus according to claim 1, wherein the reflection sheet includes a light scattering property.

13. The display apparatus according to claim 1, wherein the light source substrate is provided with a plurality of drive circuits at corresponding positions of the plurality of light sources.

14. The display apparatus according to claim 1, further comprising an optical sheet between the liquid crystal panel and the main substrate.

15. The display apparatus according to claim 14, further comprising a wavelength conversion sheet between the optical sheet and the plurality of lenses.

16. The display apparatus according to claim 1, wherein the lenses contact and cover the light sources.

17. The display apparatus according to claim 15, wherein the lenses contact and cover the light sources.

18. A light-emitting device comprising:
a main substrate that includes a central part and a peripheral part that surrounds the central part;
a plurality of light sources that are each disposed on a light source substrate on the central part of the main substrate, the peripheral part being inclined relative to the central part;
a reflection sheet that covers the main substrate and the light source substrate;
a plurality of lenses disposed to correspond to the plurality of light sources respectively,
the plurality of lenses applying optical effects to beams of light from the plurality of light sources respectively; and
one or more light reflection members that are each disposed on the peripheral part, the one or more light reflection members being sheet-shaped or film-shaped members, with the reflection sheet interposed between the one or more light reflection members and the peripheral part, the light reflection members each having reflectance that is higher than the reflectance of the main substrate,
wherein the main substrate has a rectangular shape in which a first direction is set as a longitudinal direction, and
wherein the light reflection members are each disposed on four corners of the peripheral part of the main substrate, the light reflection members each having a central fold line dividing the light reflection members into two separate portions.

* * * * *